United States Patent [19]
Shimomura et al.

[11] Patent Number: 6,140,687
[45] Date of Patent: Oct. 31, 2000

[54] HIGH FREQUENCY RING GATE MOSFET

[75] Inventors: Hiroshi Shimomura; Takehiro Hirai; Joji Hayashi, all of Osaka; Takashi Nakamura, Kanagawa, all of Japan

[73] Assignee: Matsushita Electric Industrial Co., Ltd., Osaka, Japan

[21] Appl. No.: 08/979,559

[22] Filed: Nov. 26, 1997

[30] Foreign Application Priority Data

Nov. 28, 1996 [JP] Japan .................................... 8-317636

[51] Int. Cl.[7] .................................................. H01L 29/94
[52] U.S. Cl. ........................................... 257/401; 257/390
[58] Field of Search ..................... 257/341, 343, 257/401, 390

[56] References Cited

U.S. PATENT DOCUMENTS

| | | | |
|---|---|---|---|
| 3,777,364 | 12/1973 | Schinella et al. | 257/754 |
| 4,152,714 | 5/1979 | Hendrickson et al. | 257/341 |
| 4,584,595 | 4/1986 | Kammiller | 257/365 |
| 4,961,101 | 10/1990 | Yeh et al. | 257/408 |
| 5,200,807 | 4/1993 | Eguchi | 257/774 |
| 5,355,008 | 10/1994 | Moyer et al. | 257/341 |
| 5,414,283 | 5/1995 | den Boer et al. | 257/59 |
| 5,689,129 | 11/1997 | Pearce | 257/341 |

FOREIGN PATENT DOCUMENTS

| | | |
|---|---|---|
| 0 225 821 | 6/1987 | European Pat. Off. . |
| 0 445 725 | 9/1991 | European Pat. Off. . |
| 60-110153 | 6/1985 | Japan . |
| 03257969 | 11/1991 | Japan . |
| 09064344 | 3/1997 | Japan . |

OTHER PUBLICATIONS

"ESD Resistant MOS Transistor With Improved Gate Oxide/Drain Interface", Research Disclosure, No. 366, p. 588, Oct 1, 1994.

"Field–Effect Transistor Output Driver", IBM Technical Disclosure Bulletin, vol. 28, No. 8, pp. 3497–3498, Jan. 1986.

*Primary Examiner*—John Guay
*Attorney, Agent, or Firm*—McDermott, Will & Emery

[57] ABSTRACT

In an active area surrounded with an isolation formed on a silicon substrate, a large number of unit cells are disposed in a matrix, and the unit cell together form one MOSFET. Each of the unit includes a ring gate electrode in the shape of a regular octagon, a drain region and a source region formed at the inside and outside of the gate electrode, respectively, two gate withdrawn wires extending from the gate electrode to area above the isolation, a substrate contact portion in which the surface of the substrate is exposed, and contacts for electrically connecting these elements with wires. These elements such as the ring gate electrode and the gate withdrawn wires are formed so as to attain a high frequency characteristic as good as possible. Thus a MOSFET for use in a high frequency signal device, the high frequency characteristic such as the minimum noise figure and the maximum oscillation frequency in particular can be totally improved.

6 Claims, 24 Drawing Sheets

HIGH FREQUENCY RING GATE MOSFET

BACKGROUND OF THE INVENTION

The present invention relates to a field effect transistor (FET) mounted on a high frequency LSI for use in multimedia equipment or mobile communication equipment. More particularly, it relates to a structure for realizing a low noise figure and a high maximum oscillation frequency.

Recently, the market of multimedia equipment and mobile communication equipment has been remarkably extended in accordance with increasing needs of consumers, highly developed systems resulting from the development of related arts, and newly found application of mobile communication technology. In the latest prospects, the market scale of the mobile communication service and equipment is estimated to extend to 4.5 trillion yen in 2000 and to 11 trillion yen in 2010. In accordance with such an extension of the market, more practical improvement is desired in transistors and LSIs which can deal with signals in a frequency band of the GHz area suitable to use in communication equipment, a mobile radio communication base station, satellite communication and a broadcasting station.

Conventionally, GaAs ICs, silicon bipolar ICs and BiCMOS LSIs are mainly used as devices for high frequency analog signals meeting such use. However, for example, in the field of the mobile communication, in view of realization of a low cost and small power consumption desired by users or realization of a compact system using a one-chip analog/digital LSI, a high frequency LSI which can deal with both an analog signal and a digital signal by using an FET, in particular, a MOSFET will be a prospective choice.

When a MOSFET is used as a device for a high frequency analog signal, the MOSFET has the following advantages as compared with a bipolar transistor (hereinafter referred to as BJT):

(1) High integration:

Since a MOSFET is applicable to more refinement as compared with a BJT, an area occupied by the transistor on a chip is smaller.

(2) Low distortion characteristic:

The current-voltage characteristic is exhibited as an exponential characteristic in a BJT, whereas it is exhibited as a square characteristic in a MOSFET. Accordingly, adjacency harmonics such as 2f1±f2 and 2f2±f1 do not appear in the MOSFET.

(3) High gain and high efficiency:

The optimization of the dimension (the gate width and the gate length) of a MOSFET results in a high gain and high efficiency. Thus, the number of stages in a module can be decreased, and hence, a compact and inexpensive LSI can be realized.

On the other hand, when a MOSFET is used as a device for a high frequency analog signal, the MOSFET is desired to be further improved in its several characteristics.

FIG. 20 is an equivalent circuit diagram for showing the relationship in characteristics among respective portions of a MOSFET. Now, the characteristic improvements demanded of a MOSFET will be described with reference to FIG. 20.

(1) Improvement in a transconductance gm:

In order to use a MOSFET as a device for a high frequency analog signal, it is necessary to increase a transconductance gm in order to attain a high gain.

A drain current Id of a MOSFET is represented by the following formula (1):

$$Id = (W/2L) \cdot \mu n \cdot Cox \cdot (Vgs - Vt)^2 \quad (1)$$

wherein $\mu n$ indicates mobility of electrons, Cox indicates a capacitance of a gate oxide film in a unit area, W and L respectively indicate a gate width and a gate length, Vgs indicates a gate-source voltage and Vt indicates a threshold voltage.

Also, a transconductance gm is represented by the following formula (2):

$$gm = dI/dV = (2\mu n \cdot Cox \cdot Id \cdot W/L)^{0.5} \quad (2)$$

As is understood from the formula (2), when the current Id is constant, it is necessary to increase W/L, namely, a ratio between the gate width and the gate length, in order to increase a transconductance gm.

(2) Improvement of cut-off frequency $f_T$:

A cut-off frequency $f_T$ corresponds to a frequency at which the current gain becomes 1, and is one of indexes for showing the high frequency characteristics of a device. In the cut-off frequency, a margin approximately ten times as large as that of an operation frequency is required.

A cut-off frequency $f_T$ of an FET is represented by the following formula (3):

$$f_T = gm/\pi(Cgs + Cgd) \quad (3)$$

wherein Cgs indicates a gate-source capacitance and Cgd indicates a gate-drain capacitance.

As is understood from the formula (3), a cut-off frequency $f_T$ is in proportion to a transconductance gm, and is in inverse proportion to a sum of a gate-source capacitance Cgs and a gate-drain capacitance Cgd. Accordingly, a cut-off frequency $f_T$ can be improved simply by decreasing a gate length L, which also leads to a compact and inexpensive system.

(3) Decrease of noise:

When a MOSFET is used as a device for a high frequency analog signal, it is necessary to decrease noise of the FET itself, so that a weak signal cannot be buried in noise.

In an area where a sum (Rg+Rs) of a gate resistance Rg and a source resistance Rs is large, a minimum noise figure NFmin can be approximated by the following formula (4):

$$NFmin = 1 + 2\pi \cdot f \cdot K \cdot Cgs \sqrt{\{(Rg + Rs)/gm\}} \quad (4)$$

The formula (4) is designated as Fukui's equation, wherein K is a constant.

As is understood from the formula (4), noise is lower in a transistor having a larger transconductance gm and smaller gate resistance Rg and source resistance Rs.

(4) Improvement of maximum oscillation frequency fmax:

A maximum oscillation frequency fmax corresponds to a frequency at which the power gain becomes 1, and is represented by the following formula (5):

$$fmax = f_T/2\sqrt{\{Rg(1/W) \cdot (Rds + 2\pi f \cdot Cgd + Cgs(Ri + Rs)\}} \quad (5)$$

wherein Ri indicates a channel resistance.

As is understood from the formula (5), a maximum oscillation frequency fmax is higher as a gate resistance Rg and a source resistance Rs are smaller. Furthermore, although not expressed in the formula (5), it is known that a maximum oscillation frequency fmax is higher as a source inductance Ls is smaller.

Therefore, in a MOSFET disposed in a conventional high frequency LSI, a finger-shaped gate electrode structure is adopted for improving these high frequency characteristics.

FIGS. 21(a) through 21(c) are schematic plan views for showing exemplified layouts of a MOSFET having finger-shaped gate electrodes. Specifically, for example, as is shown in FIG. 21(a), on an active area 101 surrounded with an isolation 100, a large number of gate electrodes 102 are disposed in the shape of fingers. The active areas at both sides of each gate electrode 102 function as a source region 103 or a drain region 104. In each of the source region 103 and the drain region 104, a large number of contacts 106 or 107 are formed so as to decrease a source resistance Rs or a drain resistance Rd. A contact portion 102a of each gate electrode 102 extending over the isolation 100 is provided with a gate contact 105. FIG. 21(b) is a plan view of a MOSFET in which the number of fingers is increased so as to further decrease the gate resistance Rg. FIG. 21(c) is a plan view of a MOSFET in which contact portions 102a are provided at both ends of each gate electrode 102 so as to decrease an equivalent gate resistance Rg.

As is shown in FIG. 22, as a finger length of a gate electrode in one unit cell is increased, the minimum noise figure NFmin is increased. Therefore, in the MOSFET having the layout as shown in FIG. 21(b), while retaining the total gate width constant, the minimum noise figure NFmin is decreased by increasing the number of fingers.

Furthermore, in each of the layouts shown in FIGS. 21(a) through 21(c), a salicide process which can simultaneously decrease a gate resistance Rg, a source resistance Rs and a drain resistance Rd, or a polycide process which can decrease a gate resistance Rg alone is conventionally adopted.

On the other hand, as a device for attaining both a high operation speed and small power consumption demanded of a high frequency semiconductor device, a CMOS device having an SOI (silicon-on-insulator) structure is attracting notice.

FIG. 23 is a sectional view of a conventional SOI-MOSFET including a buried oxide film. As is shown in FIG. 23, a buried oxide film 112 is disposed at a predetermined depth from the top surface of a silicon substrate 111, and an area above the buried oxide film 112 works as an active area (semiconductor area). On the active area, a gate oxide film 117 and a gate electrode 118 are formed, and an impurity at a high concentration is introduced into the active area at both sides of the gate electrode 118, so as to form a source region 113 and a drain region 114. The active area below the gate electrode 118, namely, an area between the source region 113 and the drain region 114, is doped with an impurity having a conductivity type different from that of the impurity included in the source region 113 and the drain region 114 at a concentration on a level for controlling the threshold voltage, and this area works as a channel region 115.

In such an SOI structure, a diffused layer where a current flows in the active area is separated from the silicon substrate 111 by the buried oxide film 112, that is, an insulator. Therefore, as compared with a general bulk MOSFET, a capacitance between the diffused layer and the silicon substrate 111 can be remarkably decreased. Accordingly, a MOS device formed on an SOI substrate can attain both a high speed operation and small power consumption owing to its small parasitic capacitance. As a result, such a MOS device exhibits the following satisfactory characteristics, which cannot be attained by a bulk MOS device.

First, since a substrate bias effect is small, the MOS device can be operated with ease at a low voltage. Second, since the parasitic capacitance is small, the MOS device can be operated at a high speed at a low voltage in accordance with a high frequency signal. Third, since fewer defects are caused by radiation and the like and a soft error hardly occurs, the MOS device has high reliability. Fourthly, the MOS device having a simple structure and high integration can be manufactured through a simple process.

In a MOSFET having a thin film SOI structure including a buried oxide film formed on a semiconductor substrate, two operation modes, that is, a fully depleted (FD) mode in which a Si layer in the channel region is fully depleted in an operation of the transistor and a partially depleted (PD) mode in which a portion not depleted remains in the SOI substrate in the operation, are available. Now, a substrate floating effect, which cannot be negligible for practical use of an SOI device in both modes, will be considered.

In the structure of an SOI transistor, the channel region is floated and a substrate potential cannot be fixed, which is a large difference from a bulk transistor. The most significant problem caused by the substrate floating effect is decrease of a source-drain breakdown voltage. This decrease is brought because holes generated through impact ionization in a high electric field area in the vicinity of the drain region 114 of FIG. 23 are stored below the channel region 115 and increase the potential of the channel region 115, so as to allow a parasitic bipolar transistor to be operated.

In order to suppress this parasitic bipolar transistor effect, various countermeasures have been adopted. The most reliable one among these countermeasures is to fix the substrate potential as in a bulk device (which is a so-called body contact method). FIGS. 24(a) through 24(c) illustrate typical body contact methods. The method shown in FIG. 24(a) is designated as an H-shaped gate method, in which the potential of the channel region is fixed by extending the active area from below the gate electrode 118 at the side of the channel region. The method shown in FIG. 24(b) is designated as a source-tie method, in which a $P^+$ area is formed in the source region 113, that is, an $N^+$ area in an NMOS transistor, so that the substrate potential can be prevented from increasing by collecting the generated holes in this P area. The method shown in FIG. 24(c) is designated as a field shield method, in which a field shield electrode is formed in addition to the gate electrode 118, so as to separate adjacent transistors from each other and extract the holes from a separated portion below the field shield electrode.

However, such a MOSFET having the finger-shaped electrodes used as the conventional device for a high frequency analog signal has the following problems:

(1) Decrease of maximum oscillation frequency fmax due to increase of a source inductance:

When the number of the gate fingers is increased as is shown in FIG. 21(b), although the minimum noise figure NFmin is decreased, wires connected with the drain region and the source region are unavoidably formed also in the shape of fingers, and hence, the inductance of these regions is increased owing to the wires. As described above, since a maximum oscillation frequency fmax is in inverse proportion to a source inductance, the increase of the number of fingers leads to the decrease of the maximum oscillation frequency fmax. Accordingly, in a higher frequency region, it is difficult to improve the minimum noise figure NFmin.

(2) In addition, when the number of fingers is increased for realizing low noise, the area occupied by the active area of the semiconductor device is unavoidably increased.

(3) Increased cost resulting from application of a process for decreasing the resistance of the gate electrode and the like:

When the polycide process or the salicide process is adopted in order to decrease the resistance of the gate electrode and the like, the number of procedures is naturally increased, resulting in a high manufacturing cost. Thus, an LSI unit price is increased as compared with a device manufactured through a general process.

(4) Problem in system LSI:

In the case where a high frequency system LSI is to be manufactured by forming plural circuits having a variety of functions on a common substrate, large noise of a part of the circuits largely affects the other circuits, and hence, the aforementioned disadvantages are more noticeably revealed. Accordingly, particularly a circuit desired to have a low noise characteristic is difficult to integrate. As a result, a high frequency system LSI including all circuits mounted on one chip cannot be realized.

(5) Problem in SOI structure:

The conventional body contact methods shown in FIGS. 24(a) through 24(c) have the following problems: A pattern area is increased; the hole extracting effect depends upon a channel width; and a direction of current flow is limited.

SUMMARY OF THE INVENTION

The first object of the invention is providing a semiconductor device which can realize a low noise characteristic even in a very high frequency region, despite having a MOSFET structure that can be manufactured at a low cost.

The second object of the invention is providing a semiconductor device and a method of designing the semiconductor device, having a structure suitable to a high frequency semiconductor device, in which an active area occupies as a small area as possible owing to its simple structure obtained by regularly disposing elements, and which can be manufactured at a low cost.

The third object of the invention is providing a one-chip semiconductor device including a variety of circuits used in a high frequency region through realization of a semiconductor device, by using a MOSFET structure, suitable to a circuit with a low noise characteristic required in a high frequency system LSI.

The fourth object of the invention is providing a semiconductor device suitable to an SOI-LSI exhibiting high performance in both a high speed operation in a high frequency region and small power consumption applicable to multimedia equipment and mobile communication equipment.

In order to achieve the first object, the invention provides a first semiconductor device.

The first semiconductor device of this invention comprises a unit cell formed in an active area surrounded with an isolation on a semiconductor substrate and functioning as a high frequency signal FET, and the unit cell includes a ring gate electrode formed on the active area; a drain region formed in the active area at an inside of the gate electrode; a drain contact formed on the drain region; a source region formed in the active area at an outside of the gate electrode; a source contact formed on the source region; a gate withdrawn wire connected with the gate electrode and extending from an area above the source region to an area above the isolation; and a gate contact formed on the gate withdrawn wire, and respective elements of the unit cell are formed for attaining a high frequency characteristic as good as possible.

In this structure, a current flows radially from the drain region to the source region during an operation of the FET, and hence, the source resistance can be largely decreased. Accordingly, the minimum noise figure NFmin represented by the formula (4) can be decreased. In addition, in the FET having the finger-shaped gate electrodes, the gate electrode is required to be offset toward the drain region in order to make the source resistance small and the drain breakdown voltage large. However, in such a structure, the width of the drain region, namely, the area of the drain region, cannot be limitlessly decreased because the drain contact should be formed. In contrast, in the present structure including the ring gate electrode, the drain region for forming the drain contact can be formed at the inside of the ring gate electrode in a small area. Therefore, the source resistance can be largely decreased, while retaining the drain breakdown voltage high, and the low noise characteristic required of a high frequency FET can be attained.

The gate electrode can be formed in the shape of a closed ring, or can be formed in the shape of an open ring having at least one open portion and the isolation is formed in each of the at least one open portion.

The gate withdrawn wire is preferably formed for decreasing a parasitic component that degrades the high frequency characteristic.

Preferably, the gate withdrawn wire is formed so that a gate resistance, which is varied depending upon a number and a shape of the gate withdrawn wire, provides a high frequency characteristic as good as possible.

Also preferably, the gate withdrawn wire is formed so that a gate-source capacitance, which is varied depending upon a number and a shape of the gate withdrawn wire, provides a high frequency characteristic as good as possible.

In this manner, the resistances such as the gate resistance can be decreased without adopting the salicide process, resulting in attaining good high frequency characteristics. Accordingly, while suppressing the manufacturing cost, the high frequency characteristics of the high frequency FET can be improved: In particular, the cut-off frequency $f_T$ represented by the formula (3) can be increased; and the minimum noise figure NFmin represented by the formula (4) can be decreased.

A length along a periphery of the ring gate electrode is preferably minimized in a range for enabling the drain contact to be formed on the drain region.

Thus, the minimum noise figure NFmin, which is increased as the length along the periphery of the ring gate electrode in each unit cell is increased, can be minimized.

Preferably, the source contact is formed so that a source resistance, which is determined depending upon a number and a shape of the source contact, is minimized.

Thus, the minimum noise figure NFmin represented by the formula (4) can be decreased as well as the maximum oscillation frequency fmax represented by the formula (5) can be increased.

At least a portion for connecting the source region and the source contact is preferably formed out of silicide.

Thus, the source contact resistance and the sheet resistance of the source region can be decreased. Therefore, when the number of source contacts is decreased and the area of the source region is reduced, the source resistance can be retained small. In this manner, while decreasing the area of the FET, the good high frequency characteristics can be attained.

A width of the source region corresponding to a distance between the ring gate electrode and the isolation is preferably smaller in an area below the gate withdrawn wire than in other areas.

Thus, the gate-source capacitance is decreased in the FET, and hence, the maximum oscillation frequency fmax represented by the formula (5) can be improved.

Preferably, the gate withdrawn wire is formed in an area as large as possible on the isolation.

Thus, the resistance of the gate withdrawn wire is decreased, and hence the gate resistance is decreased. As a result, the minimum noise figure NFmin represented by the formula (4) can be decreased.

The gate contact can be provided plural in number on each area of the gate withdrawn wire disposed on the isolation.

Thus, the gate contact resistance can be decreased in accordance with the increase of the number of gate contacts, resulting in decreasing the gate resistance. Accordingly, the minimum noise figure NFmin represented by the formula (4) can be further decreased.

Respective elements of the unit cell are preferably regularly formed on a principal plane of the semiconductor substrate.

Thus, the length along the periphery of the ring gate electrode can be minimized in the unit cell, while attaining a necessary total gate width. As a result, the gate resistance can be decreased, thereby decreasing the minimum noise figure NFmin.

At least the gate electrode, the gate withdrawn wire, the source region and the drain region included in the unit cell are preferably formed rotation-symmetrically about a center of the ring gate electrode on a principal plane of the semiconductor substrate.

Thus, the unit cells can be regularly disposed to form one FET. Accordingly, the entire FET can attain compactness, and the layout of wires can be simplified because the unit cells are regularly disposed. As a result, the manufacturing cost can be decreased.

The ring gate electrode can be in the shape of a square having an angle of 90 degrees between adjacent sides thereof, or alternatively, the ring gate electrode can be in the shape of an octagon having an angle of 135 degrees between adjacent sides thereof.

The semiconductor substrate is preferably a silicon substrate.

Thus, the manufacturing cost of the semiconductor device can be remarkably decreased as compared with the case where a compound semiconductor substrate is used. In addition, the resultant device can actually attain characteristics as good as those attained by using the compound semiconductor substrate.

In order to attain the second object, the invention provides a second semiconductor device.

The second semiconductor device of this invention comprises plural unit cells each formed in an active area surrounded with an isolation on a semiconductor substrate, and each of the unit cells includes a ring gate electrode formed on the active area; a drain region formed in the active area at an inside of the gate electrode; a drain contact formed on the drain region; a source region formed in the active area at an outside of the gate electrode; a source contact formed on the source region; a gate withdrawn wire connected with the gate electrode and extending from an area above the source region to an area above the isolation; and a gate contact formed on the gate withdrawn wire, and respective elements of each of the unit cells have regular shapes for allowing the plural unit cells to be regularly disposed in the active area.

Owing to this structure, the respective unit cells can be regularly disposed with the area occupied by the entire FET minimized. In addition, the gate contacts, the drain contacts, the source contacts and the substrate contacts can be connected with one another by using simply repeating wires.

At least the gate electrode, the gate withdrawn wire, the source region and the drain region of each of the unit cells can be formed rotation-symmetrically about a center of the ring gate electrode on a principal plane of the semiconductor substrate.

Furthermore, shapes of respective elements of one unit cell among the plural unit cells can be line-symmetrical to shapes of respective elements of another adjacent unit cell.

Preferably, respective elements of each of the unit cells are formed for attaining a high frequency characteristic as good as possible.

The semiconductor device can further comprise a source contact wire for connecting tips of the source contacts of the unit cells, and the source contact wire can be formed on a first layer over an area excluding areas for the drain contacts and the gate contacts and peripheral areas of the drain contacts and the gate contacts.

Thus, since the source contact wire is formed substantially all over, the source inductance can be very small, resulting in increasing the maximum oscillation frequency fmax.

The semiconductor device can further comprise a substrate contact portion formed in a part of the active area; a substrate contact formed on the substrate contact portion; and source/substrate contact wires for connecting tips of the source contacts and the substrate contacts of the plural unit cells.

Thus, the source inductance can be further decreased. Therefore, the resultant structure is suitable to a device requiring a high maximum cut-off frequency $f_T$ in particular.

The semiconductor device can further comprise substrate contact portions provided to merely unit cells disposed at a periphery among the plural unit cells in the active area; substrate contacts formed on the substrate contact portions; and substrate contact wires for connecting tips of the substrate contacts.

Thus, the wiring layout can be simplified.

In order to attain the third object, the invention provides a third semiconductor device.

The third semiconductor device of this invention comprises, on an insulating portion of a substrate, a semiconductor region, an isolation for surrounding the semiconductor region and a unit cell, and the unit cell includes a ring gate electrode formed on the semiconductor region; a channel region formed in an area below the ring gate electrode in the semiconductor region and including an impurity of a first conductivity type at a low concentration; a drain region formed in the semiconductor region at an inside of the gate electrode and including an impurity of a second conductivity type at a high concentration; a source region formed in the semiconductor region at an outside of the gate electrode and including an impurity of the second conductivity type at a high concentration; a gate withdrawn wire connected with the gate electrode and extending from an area above the source region to an area above the isolation; and a substrate contact portion formed in a part of the semiconductor region and including an impurity of the first conductivity type at a high concentration.

Owing to this structure, even in the case where a large number of unit cells are disposed in the active area, since the substrate contact portion is provided to each unit cell, the substrate potential can be fixed by using the substrate contact portion in each unit cell. Thus, a parasitic bipolar transistor can be suppressed from being generated. In addition, since the ring gate electrode is used, an edge transistor which is generated in the vicinity of the boundary between the finger-shaped gate electrode and the isolation can be avoided. Therefore, the resultant SOI transistor can be free from the parallel transistor phenomenon and can attain stable electrical characteristics. Moreover, since the area of the source region is increased as compared with that in a general FET, even when the semiconductor region on the insulating portion is thin, the source resistance can be decreased as compared with that in the conventional SOI transistor.

The substrate contact portion can be disposed at an outside of the source region, and the semiconductor device can be further provided with a carrier introducing wire connected with the gate electrode and extending from an area above the source region to an area above the substrate contact portion; and a carrier introducing area formed in an area below the carrier introducing wire in the semiconductor region and including an impurity of the first conductivity type at a low concentration.

Thus, in each unit cell, the carriers generated through the impact ionization in the channel region can be easily extracted from the carrier introducing area to the substrate contact portion. Therefore, the potential of the channel region can be fixed so as to effectively suppress the parasitic bipolar transistor from being generated.

The substrate contact portion can extend from the channel region and penetrate through the source region to reach an outside of the source region.

Thus, in each unit cell, the carriers generated through the impact ionization in the channel region can be more directly extracted to the substrate contact portion with ease. Therefore, the potential of the channel region can be fixed so as to effectively suppress the parasitic bipolar transistor from being generated.

Preferably, respective elements of the unit cell are formed for attaining a high frequency characteristic as good as possible.

In order to achieve the second object, the invention provides a method of designing a semiconductor device.

In the method of designing a semiconductor device including plural unit cells each formed on a common semiconductor substrate and having a regular shape, after any one of the plural unit cells is formed by using layout data of the one unit cell, another unit cell is formed by using the layout data of the one unit cell.

In this method, the regular shapes of the unit cells of the semiconductor device can be easily and rapidly formed. As a result, it is possible to stably manufacture a semiconductor device having high integration at a low cost.

In forming the another unit cell, the layout data of the one unit cell can be reversed, or reversed and parallel moved.

Alternatively, in forming the another unit cell, the layout data of the one unit cell can be rotated, or rotated and parallel moved on a plane.

Each of the unit cells preferably includes a ring gate electrode formed on an active area surrounded with an isolation on the semiconductor substrate; a drain region formed in the active area at an inside of the gate electrode; a source region formed in the active area at an outside of the gate electrode; and a gate withdrawn wire connected with the gate electrode and extending from an area above the source region to an area above the isolation.

In this method, the degree of freedom in using the layout data can be improved because the ring gate electrode is highly symmetrical. For example, when the layout data of one unit cell is rotated about the drain region at the inside of the ring gate electrode, the layout data of another unit cell can be easily obtained.

In order to achieve the fourth object, the invention provides a semiconductor integrated circuit device.

The semiconductor integrated circuit device of this invention comprises plural circuits formed on a common semiconductor substrate and having different functions from one another, and at least one of the plural circuits has a unit cell including an isolation formed on the semiconductor substrate so as to surround an active area; a ring gate electrode formed on the active area; a drain region formed in the active area at an inside of the gate electrode; a source region formed in the active area at an outside of the gate electrode; and a gate withdrawn wire connected with the gate electrode and extending from an area above the source region to an area above the isolation, and respective elements of the unit cell are formed for attaining a high frequency characteristic as good as possible.

In this manner, arbitrary one, two or more of the plural circuits formed on the common substrate can be manufactured by using the FET including the ring gate electrode and having good high frequency characteristics. For example, when a circuit required of a good low noise characteristic as described above is formed by using the FET including the ring gate electrode, harmful effects on the other circuits on the common substrate can be effectively avoided. Furthermore, by utilizing the high cut-off frequency characteristic of the FET including the ring gate electrode, a circuit particularly used in a high frequency region can be formed by using the FET including the ring gate electrode. In addition, the FET including the ring gate electrode can exhibit the good high frequency characteristics without using a compound semiconductor substrate as described above. Therefore, a large number of circuits for a semiconductor integrated circuit device for use in a high frequency region can be mounted on one chip, resulting in realizing compactness and a low manufacturing cost of the semiconductor integrated circuit device.

Among the plural circuits, each of other circuits except for the at least one circuit can have a unit cell including an isolation formed on the semiconductor substrate so as to surround an active area; a linear gate electrode formed on the active area; and source/drain regions formed in the active area at both sides of the gate electrode.

Thus, the entire area of the semiconductor integrated circuit device can be decreased by considering that the FET including the ring gate electrode occupies a larger area than an FET including a finger-shaped gate electrode.

In the case where the semiconductor integrated circuit device is an LSI for a portable telephone, the at least one circuit is preferably a low noise amplifier.

DETAILED DESCRIPTION OF THE INVENTION

Preferred embodiments of the invention will now be described with reference to the accompanying drawings.

(Embodiment 1)

Figure 1:
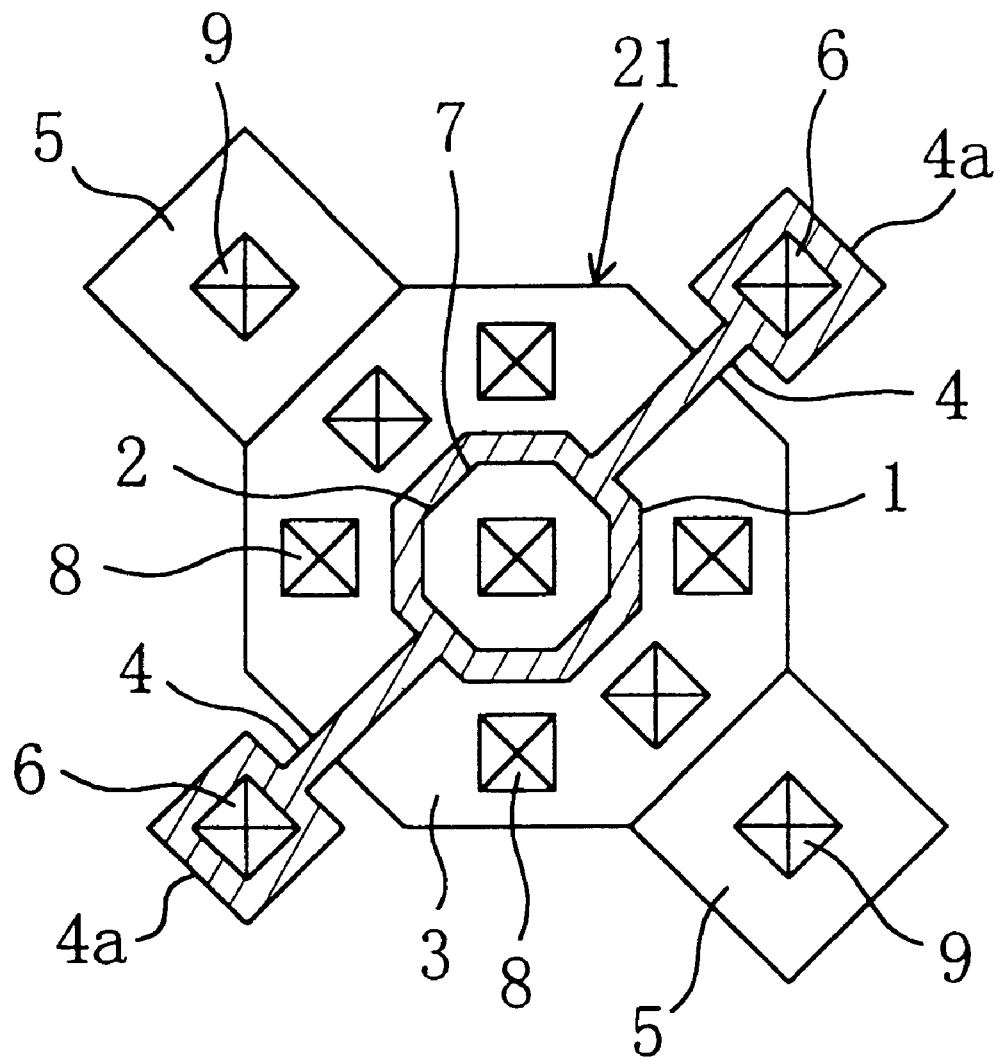
FIG. 1 is a schematic plan view for showing a layout of a unit cell of a MOSFET including a ring gate electrode in the shape of a regular octagon according to a first embodiment of the invention.
Figure 6:
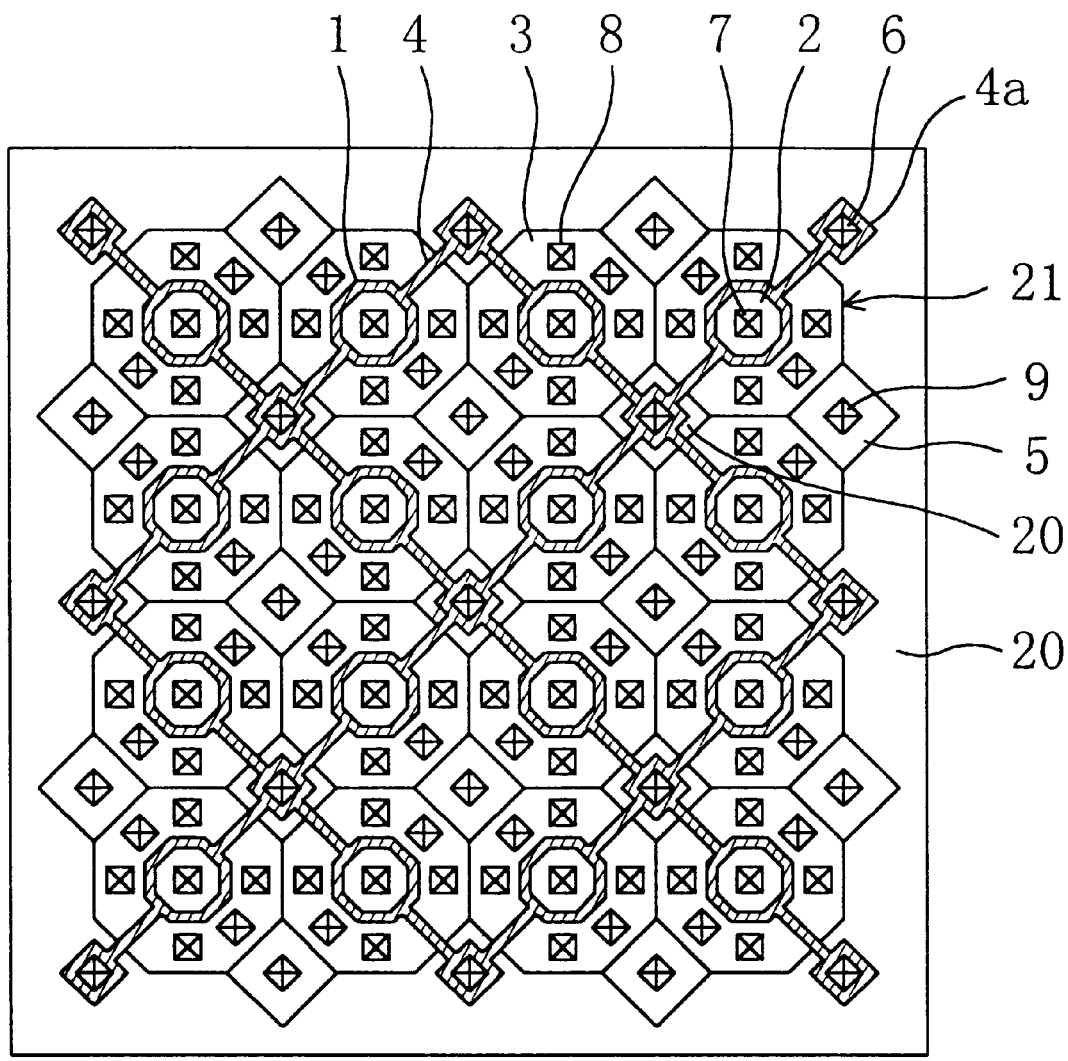
FIG. 6 is a schematic plan view for showing a layout of an exemplified MOSFET applicable to the first through fifth embodiments in which the unit cells of the first embodiment are disposed in a matrix.

FIG. 1 is a schematic plan view for showing a layout of a unit cell of a MOSFET according to a first embodiment, and FIG. 6 is a plan view for showing a cell array structure applicable to any of MOSFETs described in this embodiment and subsequent second through fifth embodiments, wherein the unit cell structure of this embodiment is shown as an example.

As is shown in FIG. 6, an active area 21 is formed in an area surrounded with an isolation on a silicon substrate, and a large number of unit cells are disposed in the active area 21. FIG. 1 illustrates merely one of these unit cells. On the silicon substrate in the active area 21, a ring gate electrode 1 in the shape of a regular octagon is formed with a gate oxide film (not shown) disposed therebelow. In the active area 21, an area at the inside of the gate electrode 1 corresponds to a drain region 2, and an area at the outside of the gate electrode 1 corresponds to a source region 3 and substrate contact portions 5. The drain region 2 and the source region 3 are doped with an impurity of the same conductivity type at a high concentration. Furthermore, an area below the gate electrode (i.e., an area below the gate oxide film) corresponds to a channel region doped with an impurity of the different conductivity type from that included in the source region 3 and the drain region 2 at a concentration on a level for controlling a threshold voltage. The substrate contact portion 5 is doped with an impurity of the conductivity type same as that included in the channel region but different from that included in the source region 3 and the drain region 2 at a high concentration. Two gate withdrawn wires 4 are extended from two opposing sides among the eight sides of the octagonal gate electrode 1. Each of the gate withdrawn wires 4 extends over the source region 3 in the active area 21 so as to reach the isolation, and is provided, at its tip, with a contact portion 4a for signal connection with an upper wire. Although not shown, the gate oxide film made from a silicon oxide film is disposed also between the gate withdrawn wires 4 and the silicon substrate. However, the silicon oxide film can be replaced with a gate insulating film of a silicon nitride film or a nitrided silicon oxide film.

From upper wires, contacts for electrical connection with respective portions of the MOSFET are formed. Specifically, each of the two contact portions 4a of the gate withdrawn wires 4 is provided with a gate contact 6, the drain region 2 is provided with one drain contact 7 at its center, the source region 3 is provided with six source contacts 8, and each of the two substrate contact portions 5 is provided with one substrate contact 9.

Figure 21A:
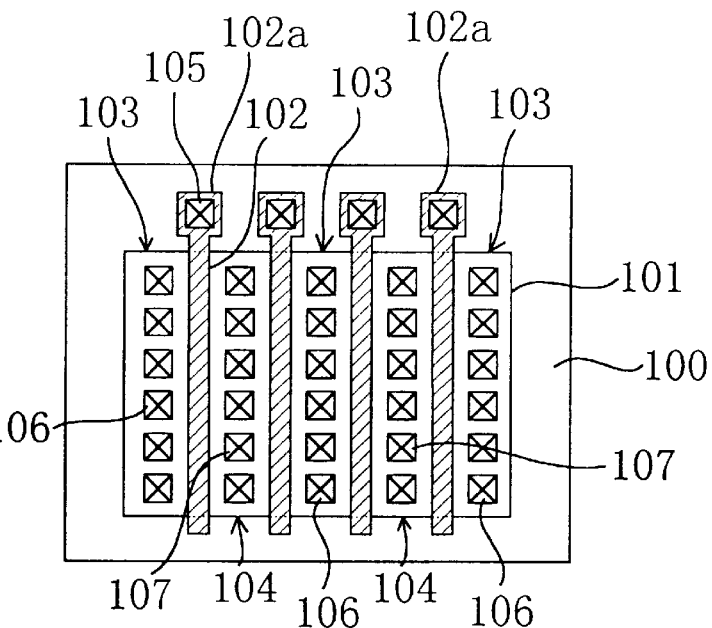
FIGS. 21(a) through 21(c) are plan views for showing exemplified configurations of a conventional MOSFET including a finger-shaped gate electrode.
Figure 21B:
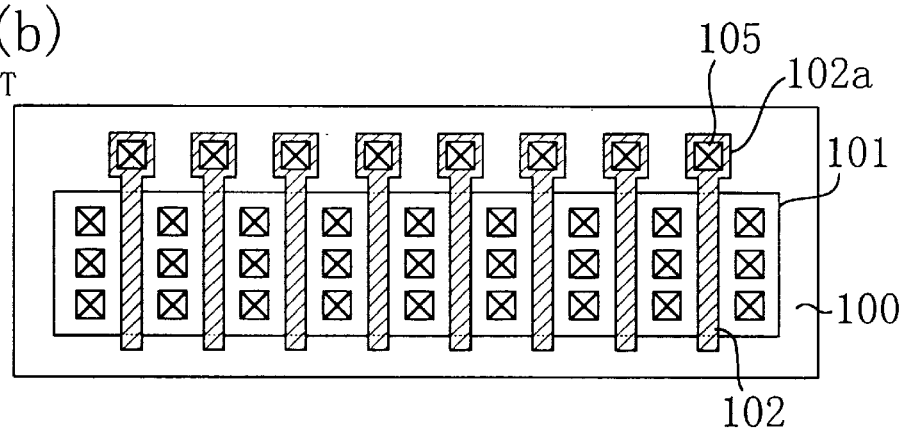
Figure 21C:
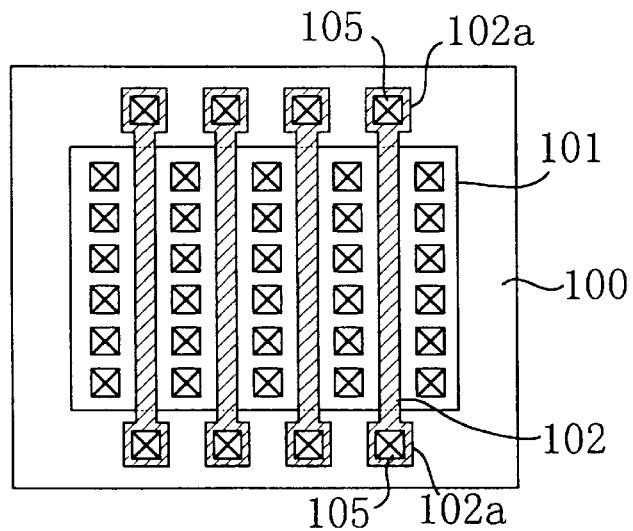
Figure 22:
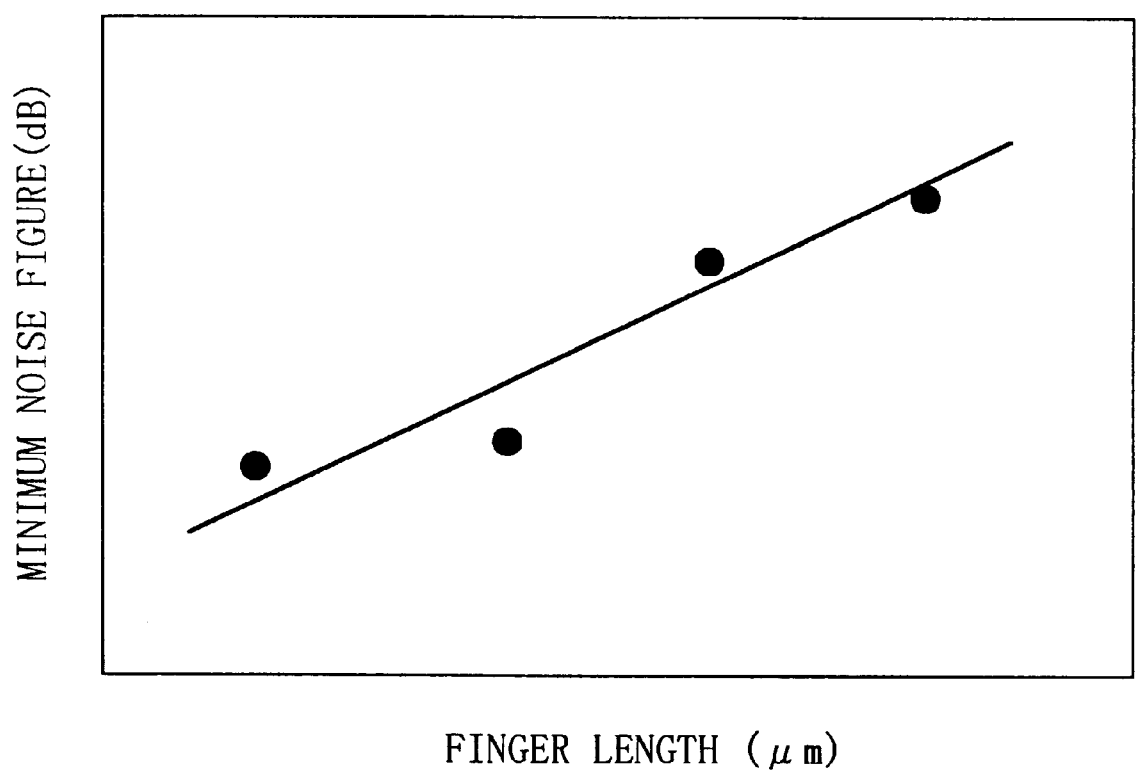
FIG. 22 is a characteristic diagram for showing a change of a minimum noise figure against a finger length in the conventional MOSFET including the finger-shaped gate electrode.
Figure 23:
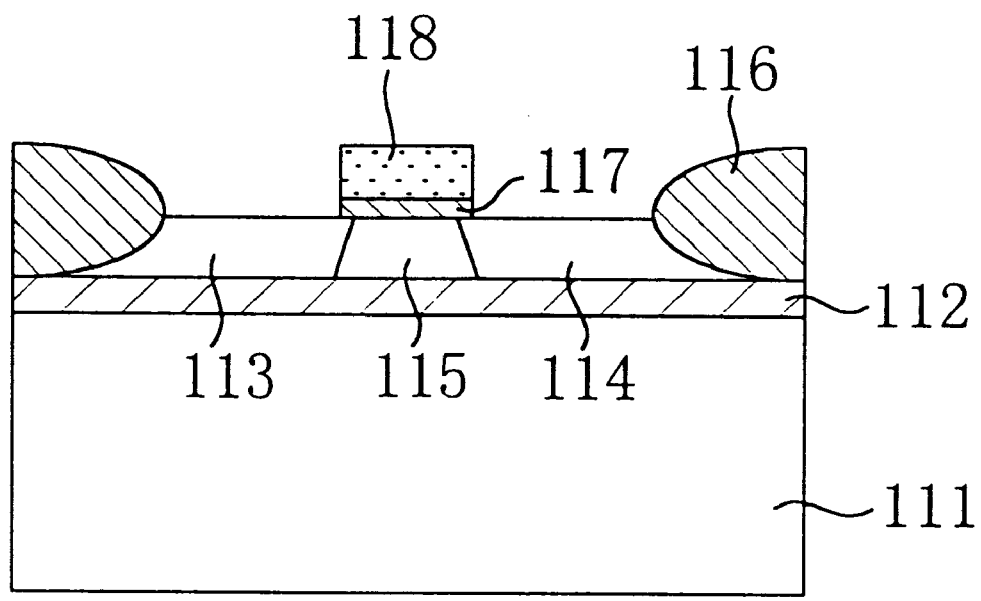
FIG. 23 is a sectional view of a unit cell of a conventional SOI-MOSFET.
Figure 24A:
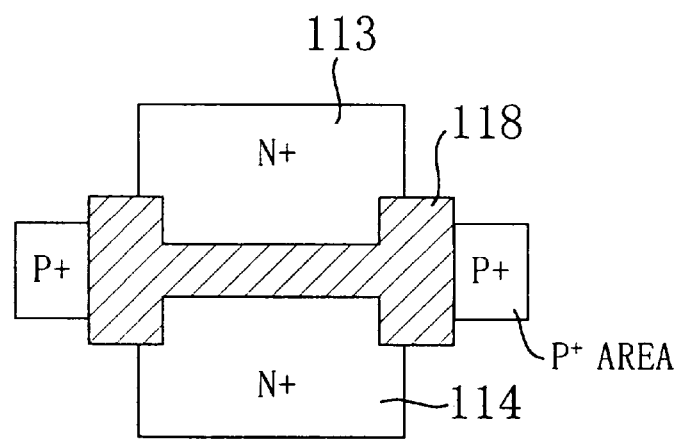
FIGS. 24(a) through 24(c) are plan views for showing various conventional methods for fixing a substrate potential.
Figure 24B:
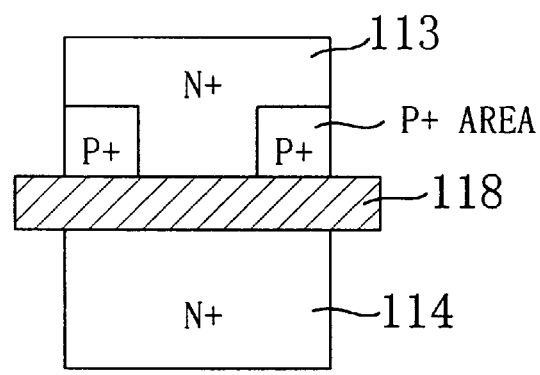
Figure 24C:
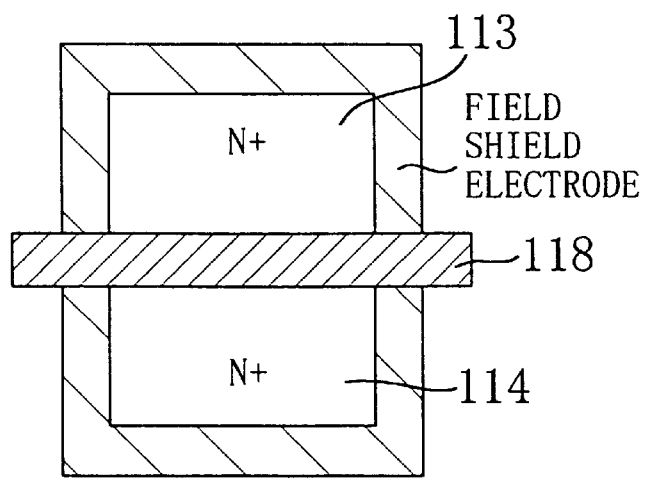

In the structure of one unit cell of the MOSFET of this embodiment, the length along the periphery of the ring gate electrode 1 can be minimized by making the drain region 2 have a small area sufficient for forming the drain contact 7 by using the ring gate electrode 1 in the shape of a regular octagon. In addition, since the gate withdrawn wires 4 are withdrawn from the two portions of the ring gate electrode 1 so as to provide the two gate contacts 6, the gate resistance Rg can be decreased. Specifically, by minimizing the length along the periphery of the ring gate electrode 1, the minimum noise figure NFmin can be decreased in the same manner as in the conventional MOSFET including the finger-shaped gate electrodes shown in FIGS. 21(*a*) through 21(*c*) having a small finger length.

Furthermore, since the source contacts 8 are disposed around the ring gate electrode 1 with an interval of 45 degrees therebetween, so as to provide one unit cell with the six source contacts 8 in total, the source resistance Rs can be decreased. In the conventional MOSFET including the finger-shaped gate electrodes (as is shown in any of FIGS. 21(*a*) through 21(*c*)), the area 104 between the two adjacent gate electrodes working as the source region is shared by the two finger-shaped gate electrodes, and hence, the source contact resistance is increased. However, in the structure of this embodiment, the source contacts 8 are circularly disposed around the gate electrode 1, and in addition, any of the source contacts 8 is not shared by another gate electrode. Therefore, the contact resistance of the source region 3 is small. Moreover, since the inside of the ring gate electrode 1 works as the drain region 2 and the outside works as the source region 3, a current can flow uniformly and radially between the source region 3 and the drain region 2. Since a current thus flows radially and the source region 3 is thus wide, the source resistance Rs is very small.

As a result, in the MOSFET of this embodiment in which a plurality of unit cells are regularly disposed, both the gate resistance Rg and the source resistance Rs can be decreased. Thus, as is understood from the aforementioned formula (4), the minimum noise figure NFmin can be effectively decreased.

In addition, since such a small source resistance can be realized, the resistances of the respective portions can be sufficiently made small without adopting the salicide process for largely decreasing the gate resistance, the source resistance and the drain resistance. In other words, a device for a high frequency signal having a minimum noise figure NFmin as small as that of a high frequency signal device formed by the salicide process can be manufactured without increasing a manufacturing cost resulting from the increased number of procedures in the salicide process.

Next, the structure of the MOSFET including the aforementioned unit cells disposed in a matrix will be described. FIG. 6 is a schematic plan view of the layout of the MOSFET including the unit cells of this embodiment disposed in a matrix. In the active area 21 surrounded with the isolation 20, four by four, i.e., 16 unit cells are disposed. The number of the unit cells is determined in accordance with a gate width W necessary for the characteristic of the MOSFET. Within the active area 21, the isolation is discontinuously present for providing the gate contact portions 4*a*.

In the MOSFET of this embodiment, each unit cell has a two-rotation symmetrical structure about the center of the ring gate electrode 1 (namely, the center of the drain region 2). Therefore, these unit cells can be disposed in a matrix with a spare space minimized for forming the MOSFET. In order to obtain the necessary gate width, the number of the unit cells is simply increased. This will be described in detail below.

For obtaining the cell array structure as is shown in FIG. 6, when the layout data of one unit cell is available, the layout data of other unit cells can be easily and rapidly generated by using the available data. For example, the layout data of the unit cell at the upper right end of FIG. 6 is rotated by 180 degrees with the drain contact 7 as a center and the obtained data is parallel moved. Thus, the layout data of the unit cell below and adjacent to the initial unit cell can be obtained. Furthermore, the layout data of the unit cell at the upper right end is turned over (reversed) with regard to a line between the center of the lower substrate contact 9 and the center of the lower gate contact 6. Thus, the layout data of the unit cell below and adjacent to the initial unit cell can be obtained. Alternatively, the layout data of the unit cell at the upper right end of FIG. 6 is rotated by 90 degrees with the lower left gate contact 6 as a center. Thus, the layout data of the unit cell below and adjacent to the initial unit cell can be obtained. Similarly, the layout data of other unit cells can be easily generated through the rotation, the reversal, a combination of the rotation and the parallel movement, a combination of the reversal and the parallel movement, a combination of the rotation and the reversal, or a combination of the rotation, the reversal and the parallel movement in accordance with the symmetry between the unit cells. The layout data of one unit cell can be thus utilized similarly in any of the subsequent embodiments. In such a case, the substrate contact portions 5, the substrate contacts 9, the island isolations 20, the gate contact portions 4*a* and the gate contacts 6 are shared by all the surrounding unit cells (by the four unit cells in this embodiment).

It is not necessary that the unit cell of this embodiment is two-rotation symmetrical about the center of the ring gate electrode 1, but the unit cell can be three- or more-rotation symmetrical. However, the degree of freedom is reversely degraded in adopting too higher rotation symmetry, and hence, the unit cell is preferably at most six- or less rotation symmetrical. This also applies to any of the following embodiments.

(Embodiment 2)

Figure 2:
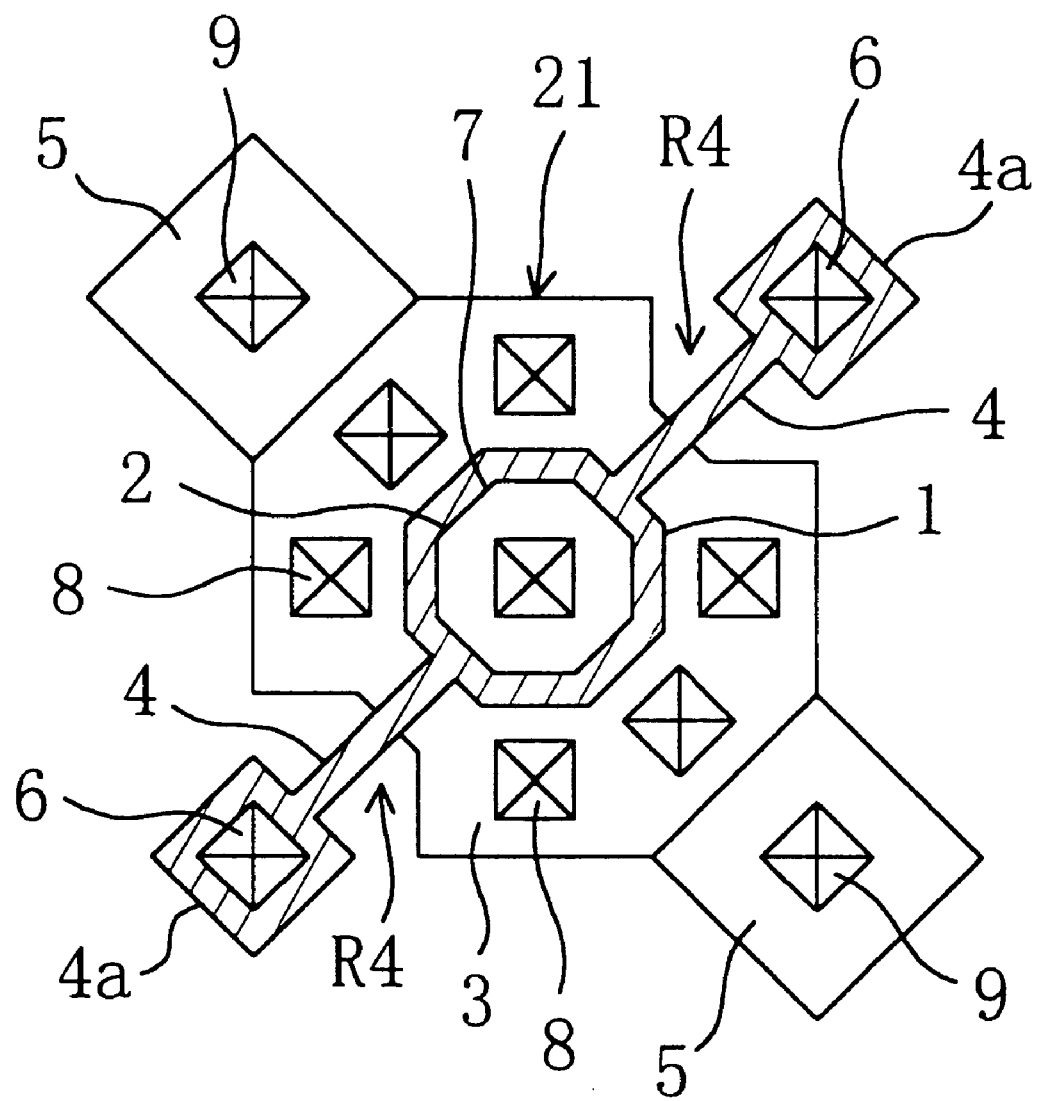
FIG. 2 is a schematic plan view for showing a layout of a unit cell of a MOSFET including a ring gate electrode in the shape of a regular octagon and a source region narrowed below a gate withdrawn wire according to a second embodiment of the invention.

FIG. 2 is a schematic plan view for showing a layout of a unit cell of a MOSFET according to a second embodiment. The MOSFET of this embodiment has the same configuration as that of the first embodiment in including a ring gate electrode 1 in the shape of a regular octagon, a drain region 2 at the inside of the gate electrode 1 and a source region 3 at the outside of the gate electrode 1. However, the configuration of this MOSFET is different from that of the first embodiment in the source region 3 (active area) narrowed below each gate withdrawn wire 4. Specifically, in an area R4 below each gate withdrawn wire 4, the isolation is closer to the gate electrode 1 and a distance between the isolation and the gate electrode 1 is smaller in this embodiment.

In the MOSFET of this embodiment, since the area of the source region 3 is thus reduced below the gate withdrawn wire 4, the gate-source capacitance Cgs can be decreased. On the other hand, as is represented by the formula (3), the cut-off frequency $f_T$ of a MOSFET is in inverse proportion to the sum of the gate-source capacitance Cgs and the gate-drain capacitance Cgd. Accordingly, this embodiment provides a MOSFET having a high cut-off frequency $f_T$ by decreasing the gate-source capacitance Cgs in particular.

(Embodiment 3)

Figure 3:
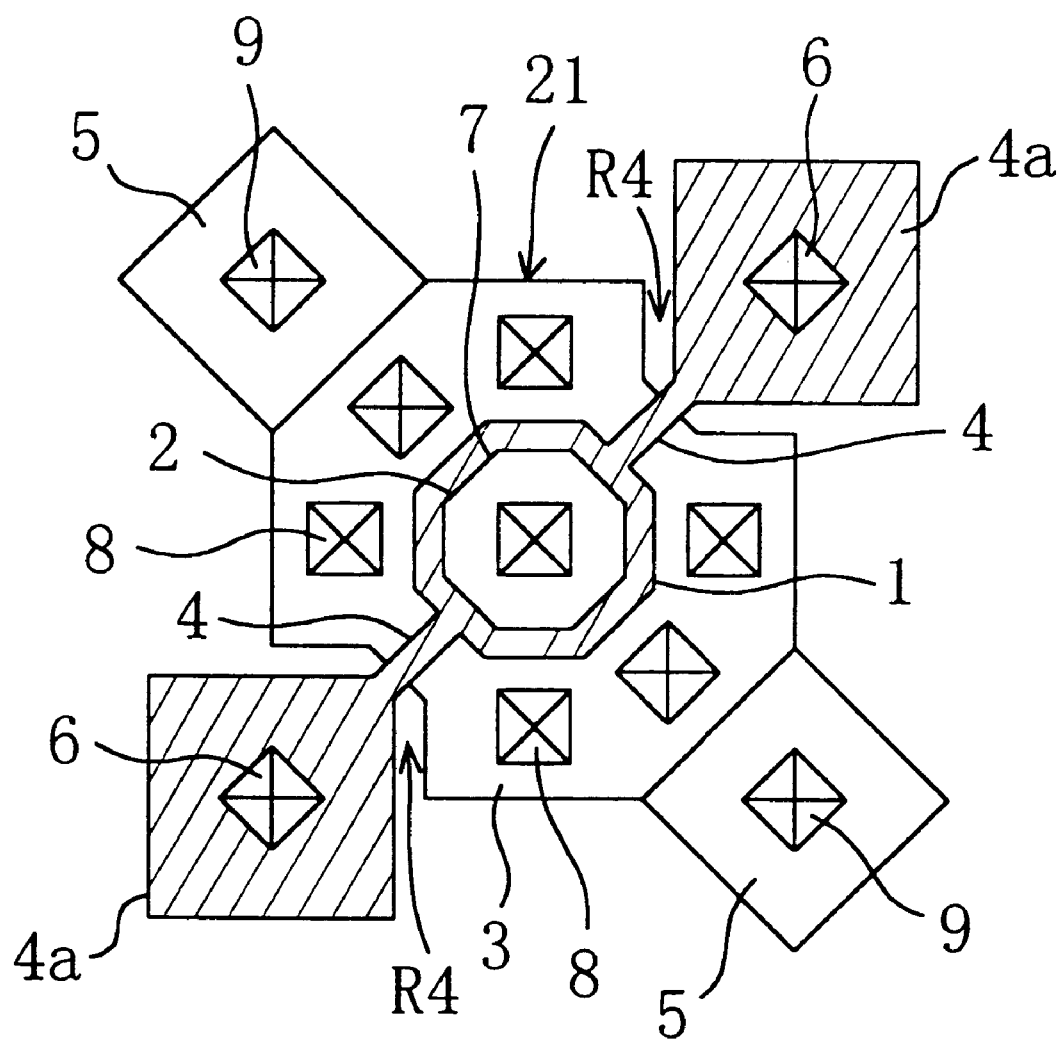
FIG. 3 is a schematic plan view for showing a layout of a unit cell of a MOSFET including a ring gate electrode in the shape of a regular octagon, a source region narrowed below a gate withdrawn wire and an enlarged gate contact portion according to a third embodiment of the invention.

FIG. 3 is a schematic plan view for showing a layout of a unit cell of a MOSFET according to a third embodiment. The MOSFET of this embodiment has the same configuration as that of the second embodiment in including a ring gate electrode 1 in the shape of a regular octagon, a drain region 2 at the inside of the gate electrode 1 and a source region 3 at the outside of the gate electrode 1 and in the source region 3 (active area) narrowed below each gate withdrawn wire 4. However, this embodiment is different from the second embodiment in forming a gate contact portion 4*a* as large as possible, so that the gate widthdrawn wire 4 between the gate electrode 1 and the gate contact portion 4*a* can be very short.

In the MOSFET of this embodiment, since each gate contact portion 4a is expanded to the narrow portion of the source region 3 so that the isolation can be closer to the gate electrode 1 and that the gate withdrawn wire 4 can be shorter, the gate resistance Rg can be made small in particular. Specifically, as is understood from the formula (4), this embodiment provides a MOSFET having a small minimum noise figure NFmin.

In the structure of -the MOSFET shown in FIG. 3, each gate contact portion 4a is provided with one gate contact 6, but several gate contacts can be provided on each gate contact portion 4a with ease because the gate contact 4a is thus expanded. By providing several gate contacts 6, the gate resistance Rg can be further decreased, resulting in further improving the high frequency characteristics of the resultant MOSFET.

(Embodiment 4)

Figure 4:
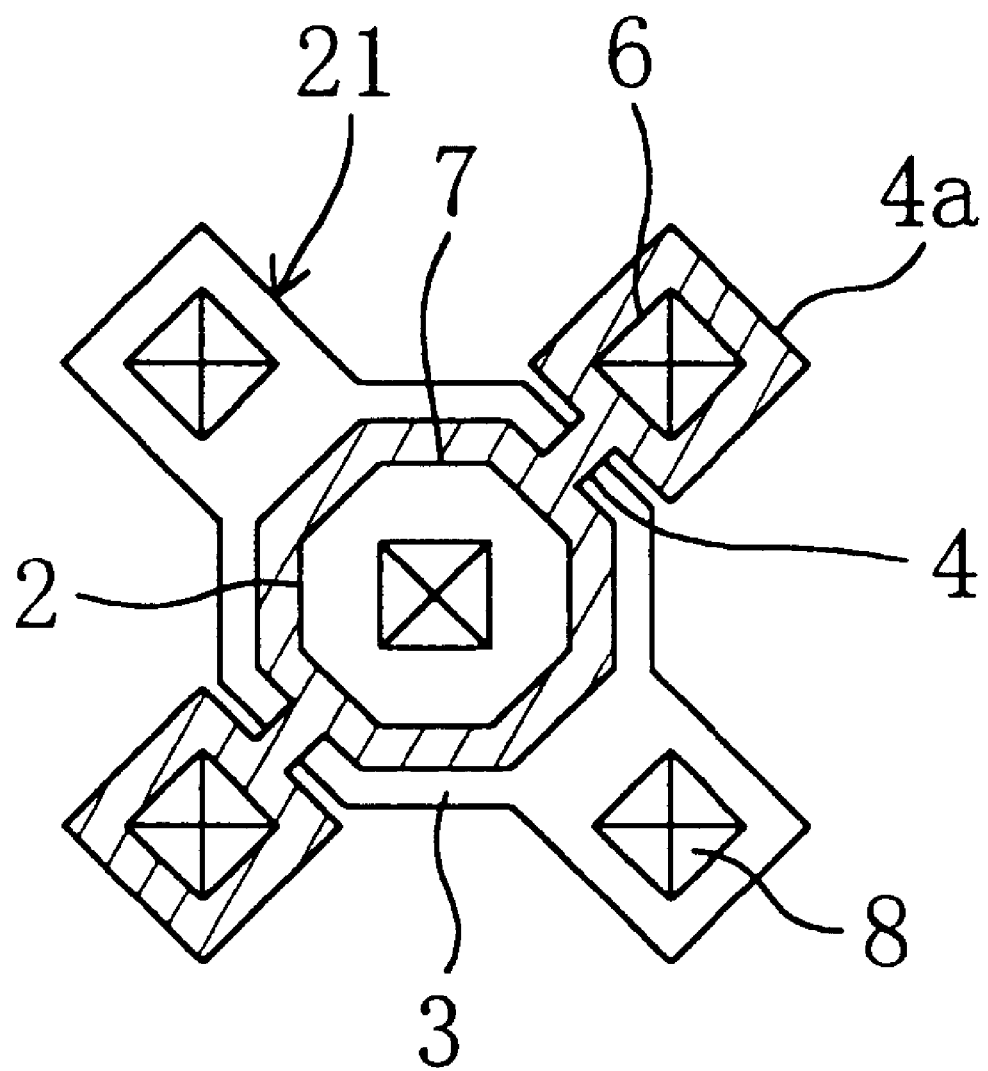
FIG. 4 is a schematic plan view for showing a layout of a unit cell of a MOSFET formed through a salicide process and including a ring gate electrode in the shape of a regular octagon, a source region and a drain region according to a fourth embodiment of the invention.

FIG. 4 is a schematic plan view for showing a layout of a unit cell of a MOSFET according to a fourth embodiment. In this embodiment, the structure of a MOSFET obtained by adopting the salicide process is described in particular. The MOSFET of this embodiment has the same configuration as that of any of the first through third embodiments described above in including a ring gate electrode 1 in the shape of a regular octagon, a drain region 2 at the inside of the gate electrode 1 and a source region 3 at the outside of the gate electrode 1. However, the MOSFET of this embodiment includes merely two source contacts 8 at positions two-rotation symmetrical about the center of the gate electrode 1.

Since the MOSFET of this embodiment is formed through the salicide process, the manufacturing cost is higher as compared with that of the MOSFETs of the first through third embodiments. However, by adopting such a configuration suitable to the salicide process, the number of the source contacts 8 can be much smaller than that formed through the general process, and hence, the area occupied by the source region 3 can be very small. Accordingly, the resultant MOSFET occupies a very small area while having a small source resistance Rs and a small gate resistance Rg to the same extent as those of the first through third embodiments.

(Embodiment 5)

Figure 5:
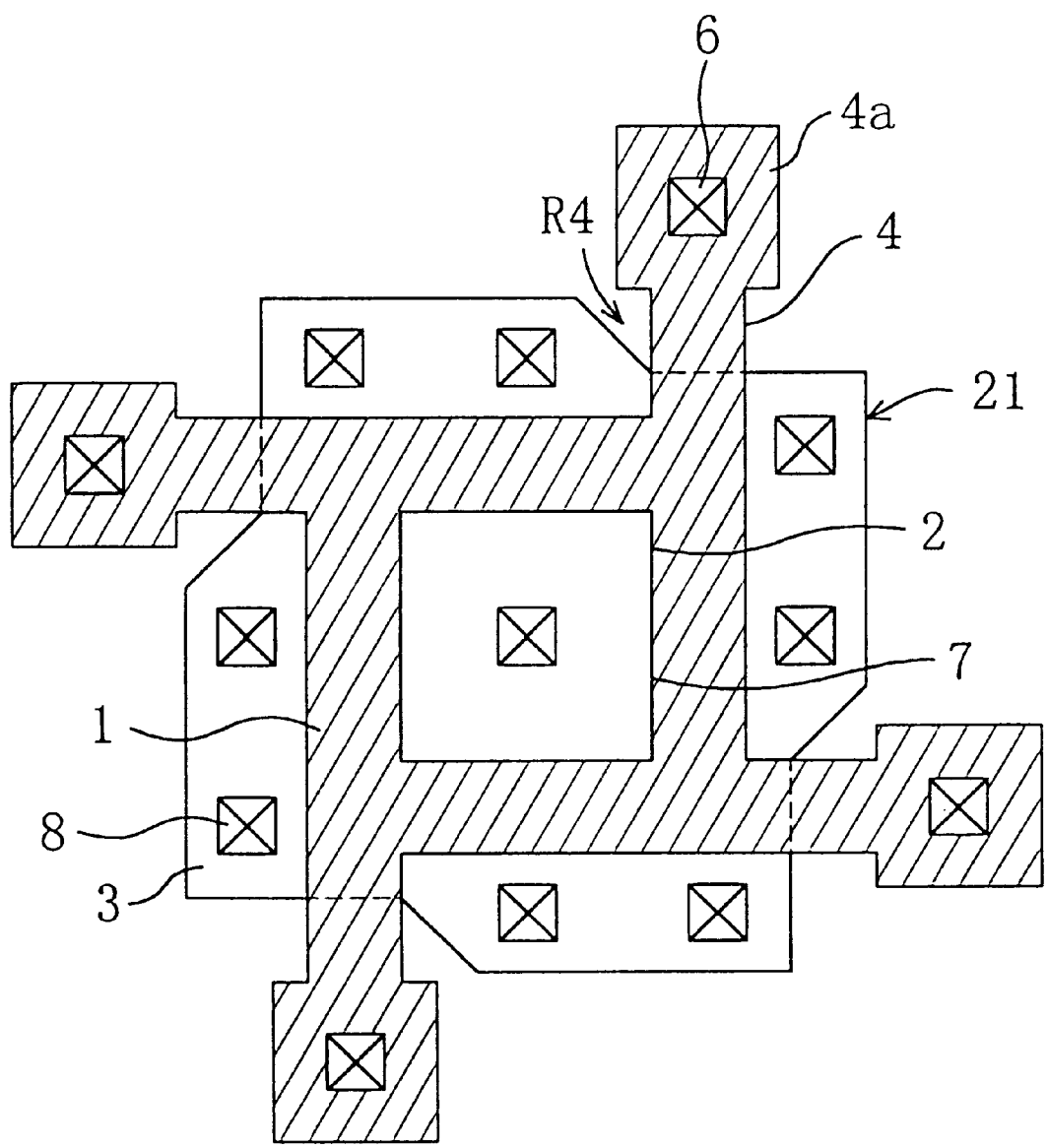
FIG. 5 is a schematic plan view for showing a layout of a unit cell of a MOSFET including a ring gate electrode in the shape of a regular square and a source region narrowed below a gate withdrawn wire according to a fifth embodiment of the invention.

FIG. 5 is a schematic plan view for showing a layout of a unit cell of a MOSFET according to a fifth embodiment. The MOSFET of this embodiment is different from those of the first through third embodiments in including a ring-shaped electrode 1 in the shape of a regular square in an active area 21 surrounded with an isolation, four gate withdrawn wires 4 extended from four portions of the gate electrode 1, and four gate contact portions 4a formed at four portions above the isolation. Similarly to the MOSFETs of the first through third embodiments, the inside of the gate electrode 1 corresponds to a drain region 2, the outside of the gate electrode 1 corresponds to a source region 3, and the gate contact portions 4a, the drain region 2 and the source region 3 are respectively provided with contacts 6, 7 and 8. Furthermore, the source region 4 is made narrower below each gate withdrawn wire 4 similarly to the MOSFET of the second embodiment.

The MOSFET of this embodiment can basically exhibit the same effects as the MOSFET of the second embodiment. In addition, since the MOSFET of this embodiment includes the gate withdrawn wires 4 connected with the four portions of the gate electrode 1, the gate resistance Rg can be advantageously further decreased.

Although the entire layouts of the MOSFETs including a plurality of the unit cells of the second through fifth embodiments are neither shown nor described, layouts in which the respective unit cells are disposed in a matrix similarly to those in the MOSFET of the first embodiment shown in FIG. 6 can be adopted.

However, in the present invention, the respective unit cells are not necessarily disposed in a matrix. As far as the respective unit cells are regularly disposed, for example, by providing a ring gate electrode in the shape of a regular triangle and forming each unit cell in a three-rotation symmetrical shape about the center of the ring gate electrode, the unit cells can be disposed and wired with ease, and the area of the MOSFET can be effectively decreased.

(Embodiment 6)

In this embodiment and each of subsequent embodiments, a wire layout of a MOSFET will be described, and for the sake of convenience, a wire layout in adopting the structure of the MOSFET of the first embodiment (shown in FIG. 6) will be exemplified.

Figure 7:
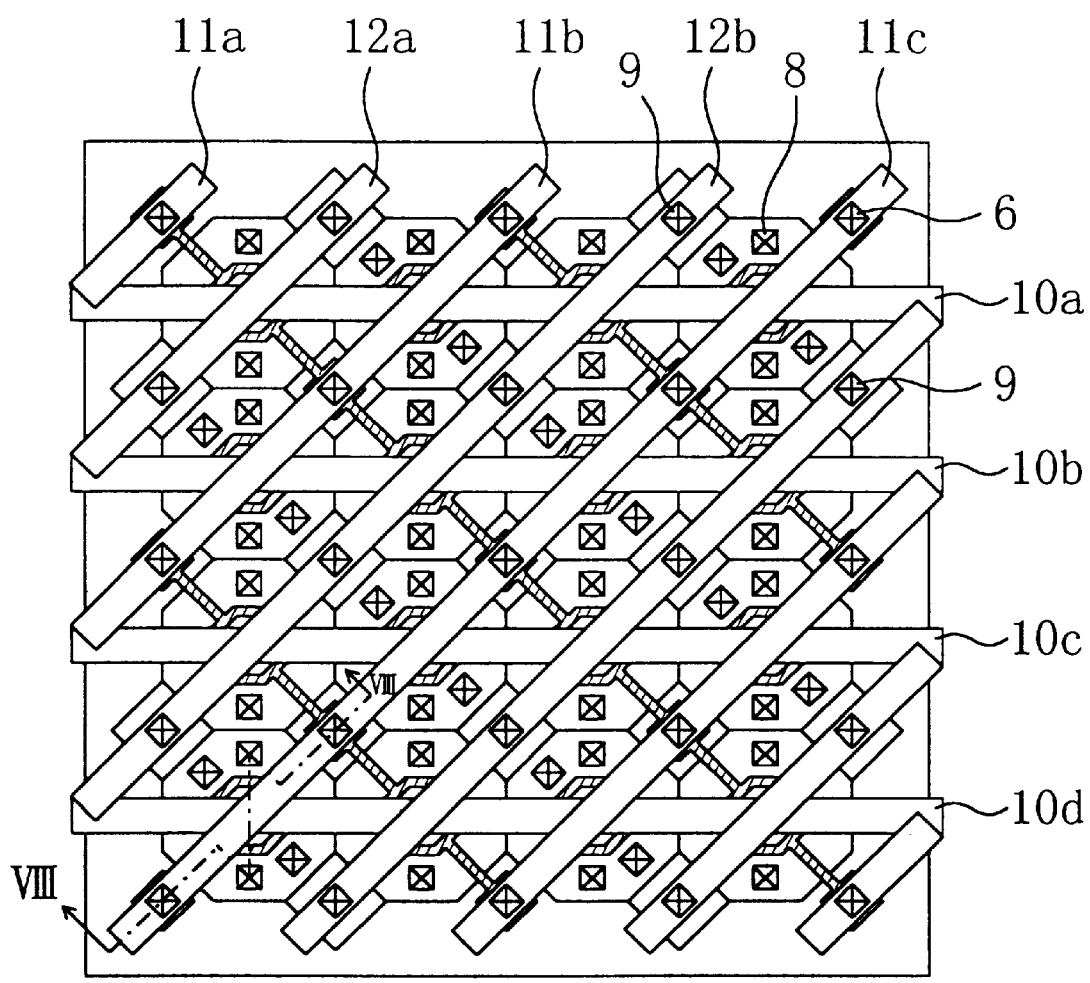
FIG. 7 is a schematic plan view for showing a layout of a MOSFET according to a sixth embodiment in which the unit cells of the first embodiment are disposed in a matrix and provided with wires.
Figure 8:
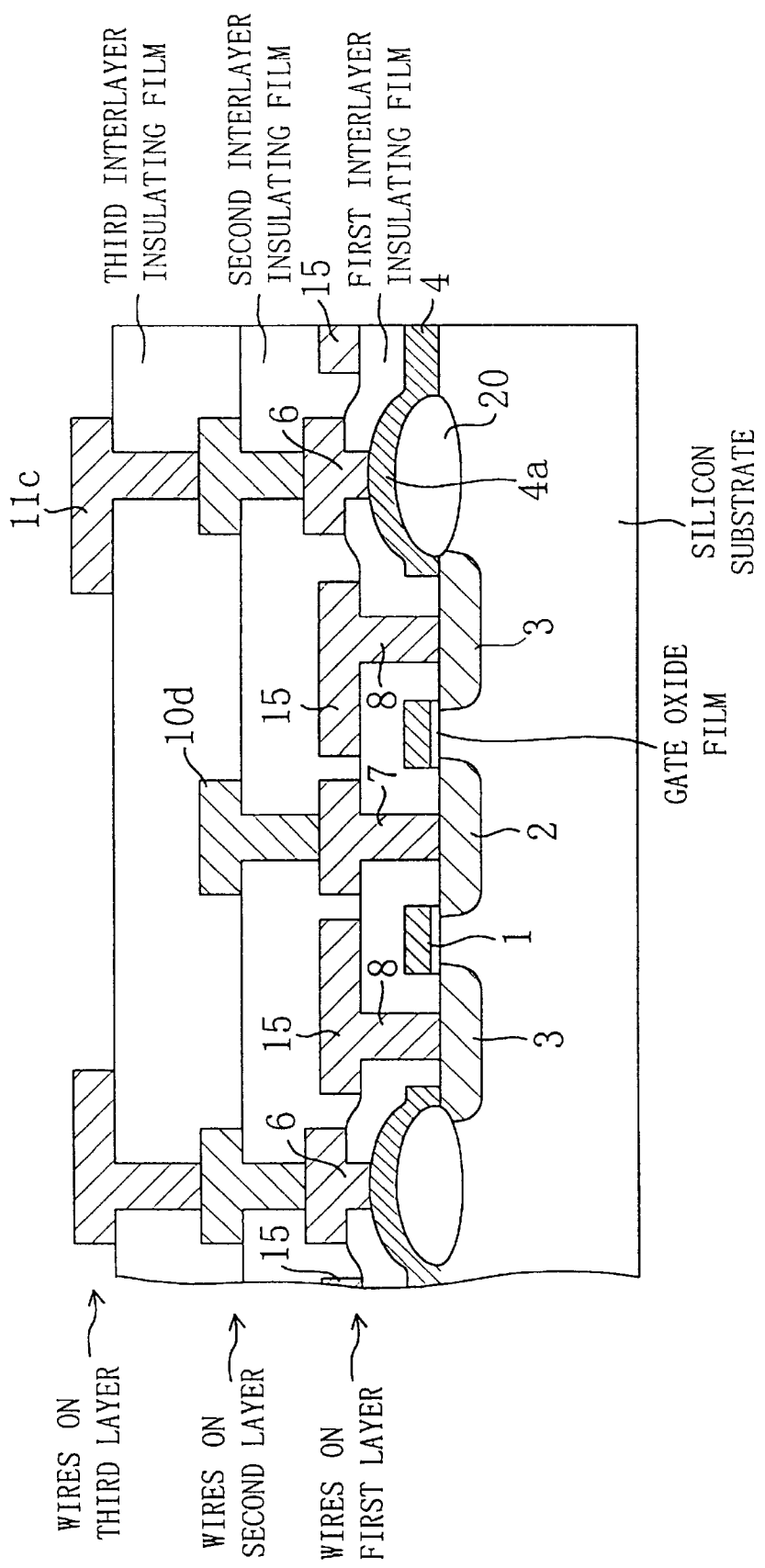
FIG. 8 is a sectional view of the MOSFET taken on line VIII—VIII of FIG. 7.

FIG. 7 is a schematic plan view for showing a wire layout according to a sixth embodiment, and FIG. 8 is a sectional view taken on line VIII—VIII of FIG. 7, both of which show the structure of the MOSFET of FIG. 6 provided with wires. However, in FIG. 7, a wire on a first layer is not shown for avoiding complication. As is shown in FIGS. 7 and 8, the wire on the first layer is a source contact wire 15 for connecting the source contacts 8, and the source contact wire 15 is formed substantially all over in a wide area excluding areas for the drain contacts 7, the gate contacts 6 and the substrate contacts 9. As wires on a second layer, drain contact wires 10a through 10d are disposed for connecting the drain contacts 7 of the respective unit cells. Furthermore, as wires on a third layer, gate contact wires 11a through 11c for connecting the gate contacts 6 and substrate contact wires 12a and 12b (which do not appear in the sectional view of FIG. 8) for connecting the substrate contacts 9 are alternately disposed so as to extend in a direction at 45 degrees against the wires on the second layer. Between the surface of the substrate and the wire on the first layer and between the wire on each layer and another wire on an upper layer, first through third interlayer insulating films are respectively interposed.

In the wire layout of the MOSFET of this embodiment, the source contact wire 15 is formed substantially all over in the wide area, and hence, the source inductance Ls can be decreased. Although not expressed in the formula (5), it is known that the maximum oscillation frequency fmax is increased when the source inductance is decreased as described above. Therefore, the MOSFET of this embodiment can attain a high maximum oscillation frequency fmax.

(Embodiment 7)

Figure 9:
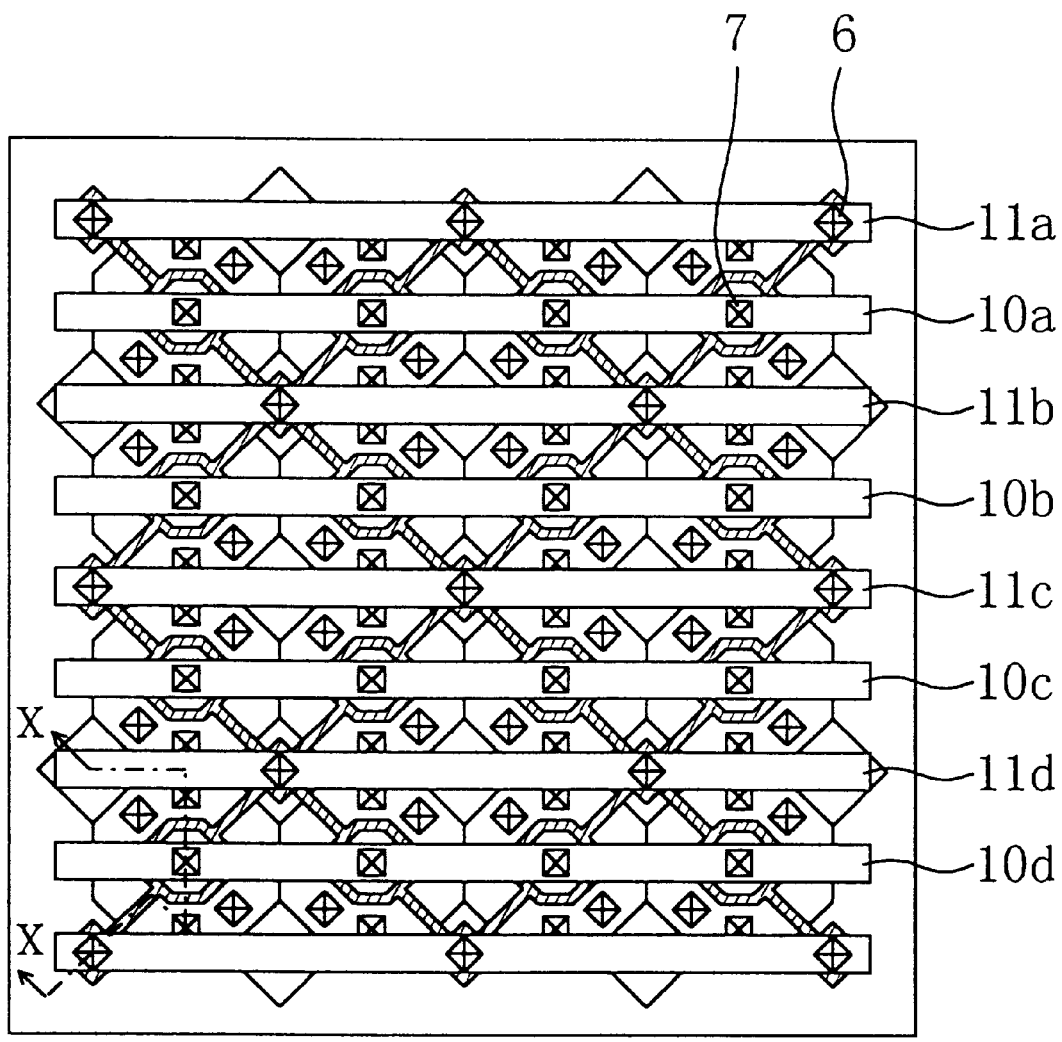
FIG. 9 is a schematic plan view for showing a layout of a MOSFET in which unit cells of a seventh embodiment are disposed in a matrix and provided with wires.
Figure 10:
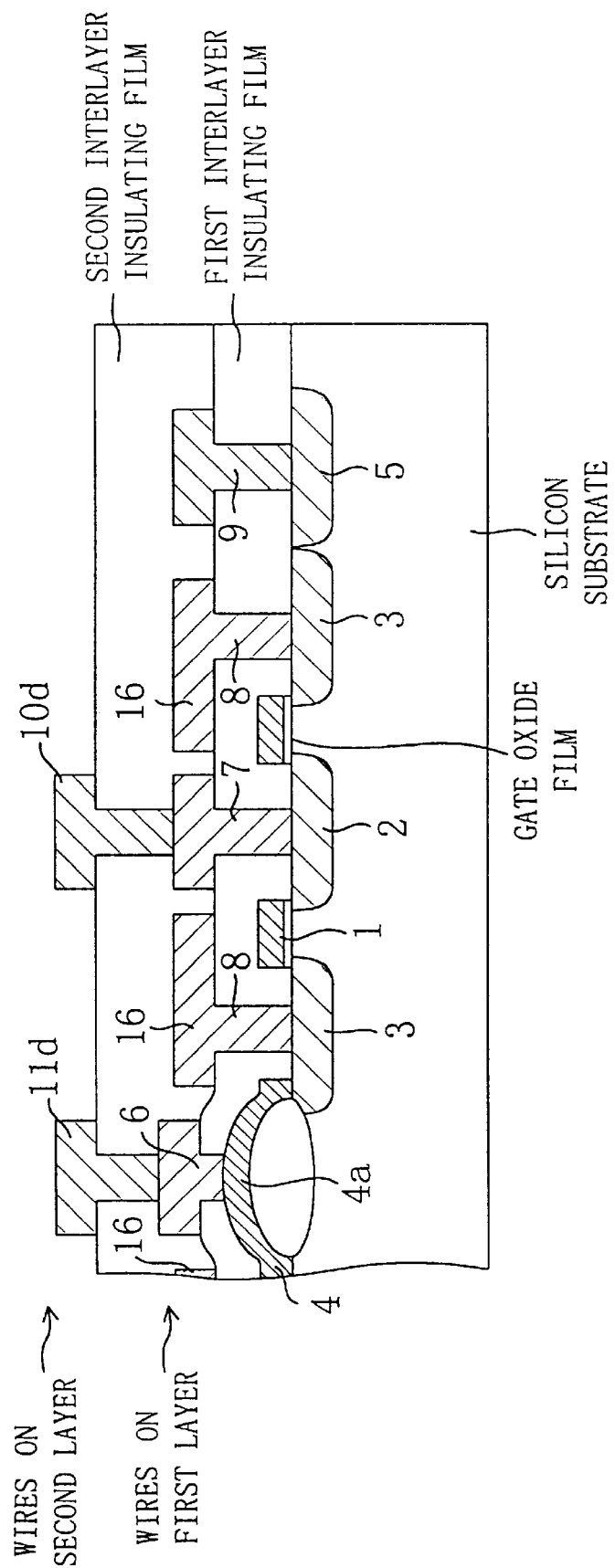
FIG. 10 is a sectional view of the MOSFET taken on line X—X of FIG. 9.

FIG. 9 is a schematic plan view for showing a wire layout of a MOSFET according to a seventh embodiment, and FIG. 10 is a sectional view taken on line X—X of FIG. 9, both of which show the structure of the MOSFET of FIG. 6 provided with wires. In FIG. 9, a wire on a first layer is not shown for avoiding complication. As is shown in FIG. 10, the wire on the first layer is a source/substrate contact wire 16 for connecting the source contacts 8 and the substrate contacts 9 of the respective unit cells. The source/substrate contact wire 16 is formed substantially all over in a wide area excluding areas for the drain contacts 7 and the gate contacts 6. Also, as is shown in FIG. 9, wires on a second layer are drain contact wires 10a through 10d for connecting the drain contacts 7 and gate contact wires 12a through 12d for connecting the gate contacts 6.

In this embodiment, the source/substrate contact wire 16, formed by short-circuiting a source contact wire and a substrate contact wire, is flatly formed in the wide area, and hence, the source inductance Ls can be decreased in particular. Therefore, this layout is suitable to a circuit, such as an oscillator, where a high maximum oscillation frequency fmax is required. Furthermore, since the number of wire layers is two, this layout is advantageous in a decreased number of procedures and a low manufacturing cost.

(Embodiment 8)

Figure 11:
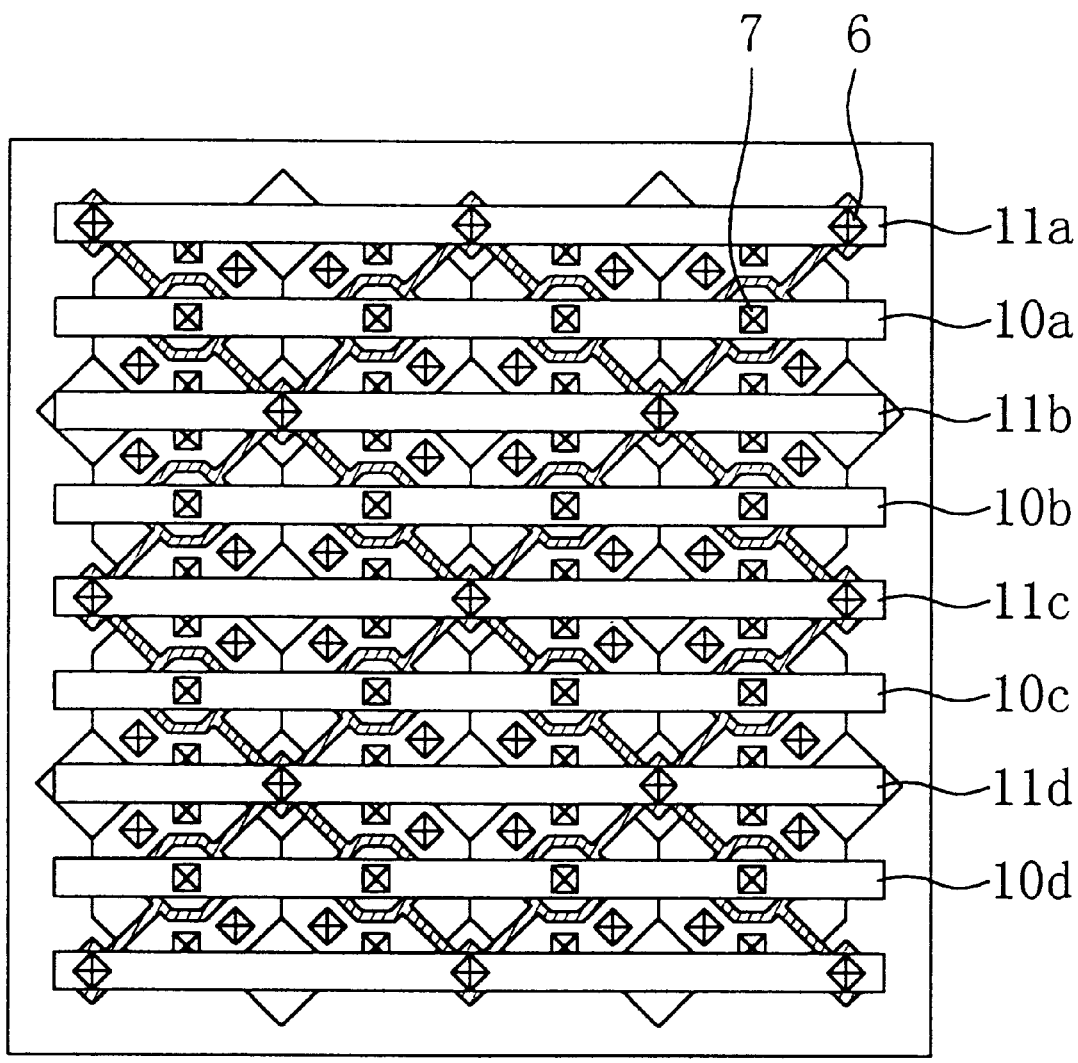
FIG. 11 is a schematic plan view for showing a layout of a MOSFET in which unit cells of an eighth embodiment are disposed in a matrix and provided with wires.

FIG. 11 is a schematic plan view for showing a wire layout of a MOSFET according to an eighth embodiment, in which the MOSFET of FIG. 6 is provided with wires. In this embodiment, the sectional view is omitted because it can be easily presumed on the basis of the sectional views of FIGS. 8 and 10. Although a wire on a first layer is not shown in FIG. 11, the wire on the first layer is a source contact wire for connecting the source contacts 8 of the respective unit cells, and is formed substantially all over in a wide area excluding areas for the drain contacts 7, the gate contacts 6 and the substrate contacts 9. Furthermore, wires on a second layer are drain contact wires 10a through 10d for connecting the drain contacts 7, and gate contact wires 11a through 11d for connecting the gate contacts 6. In this embodiment, the substrate contacts are formed merely on the substrate contact portions of peripheral unit cells.

The layout of the wires can be simplified in this embodiment, and hence, the manufacturing cost can be advantageously decreased.

Now, data for showing the effects of the semiconductor devices according to the first through eighth embodiments will be described.

Figure 12:
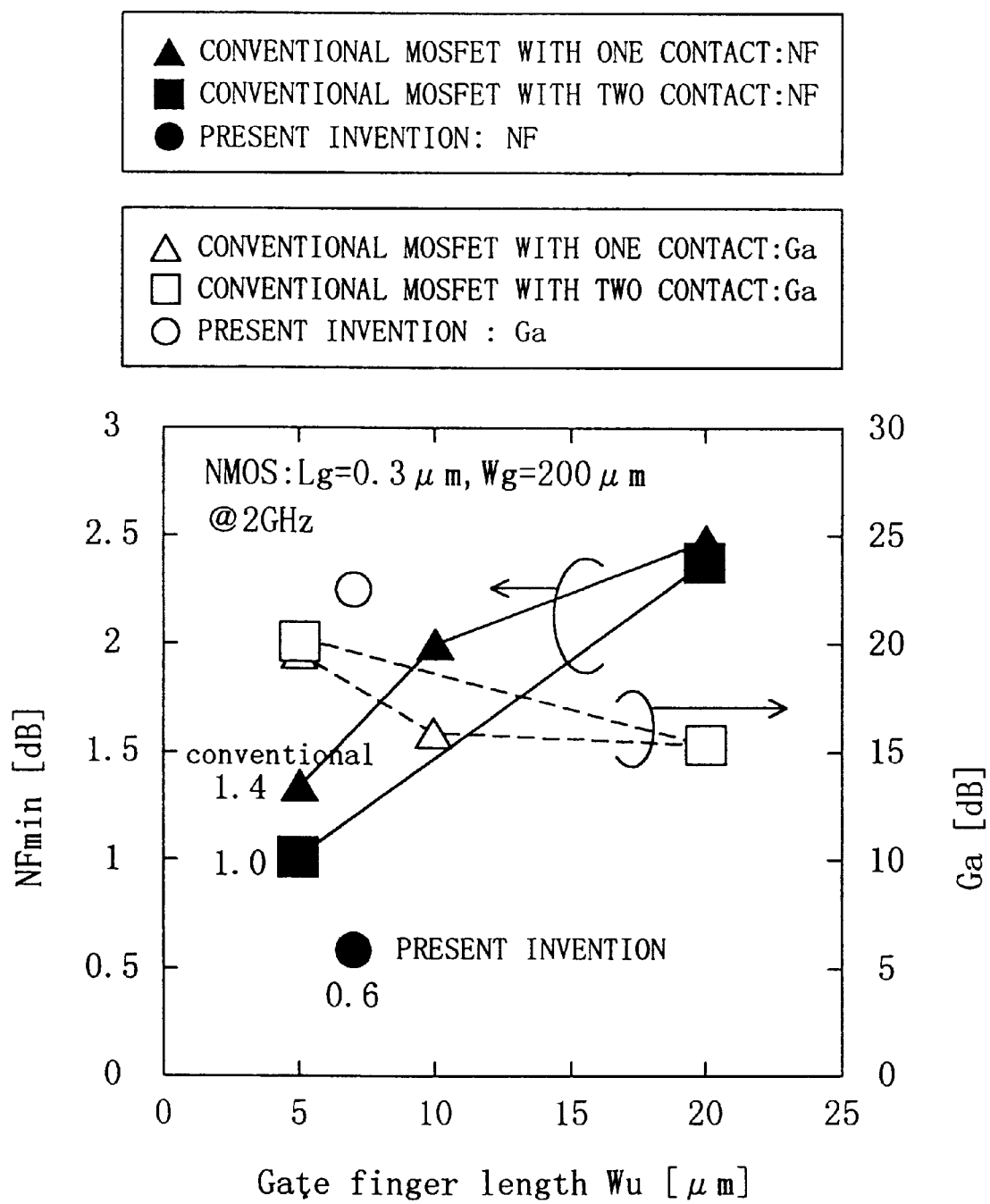
FIG. 12 is a diagram for showing data on dependency of a minimum noise figure and a gain on a gate width in the MOSFET of this invention and conventional MOSFETs.

FIG. 12 is a diagram for showing comparison in the minimum noise finger NFmin and the gain Ga between the conventional MOSFETs including the finger-shaped gate electrodes and the present MOSFET including the ring gate electrode. In FIG. 12, the abscissa indicates a unit gate width Wu of one unit cell, and the unit gate width Wu corresponds to a length along the periphery of one ring gate electrode in the present MOSFET and corresponds to a finger length of one finger gate electrode in the conventional MOSFETS. Furthermore, with regard to the conventional MOSFETS, data on one provided with a contact at one end of the gate electrode (one-contact) and data on one provided with contacts at both ends of the gate electrode (two-contact) are shown. Moreover, both the conventional MOSFETs are formed through the salicide process, but the data of the present MOSFET is obtained from the MOSFET of the first embodiment not formed through the salicide process. In any of the MOSFETs, the total gate width Wg is 200 μm, the gate length along the channel direction is 0.3 μm, and a used signal has a frequency of 2 GHz. As is shown in FIG. 12, in the present MOSFET, the minimum noise figure NFmin can be decreased without adopting the salicide process as compared with that of the conventional MOSFETs formed through the salicide process, and the gain Ga is also improved in the present MOSFET. Thus, the effects described in the aforementioned first embodiment and the like are substantiated.

Figure 13:
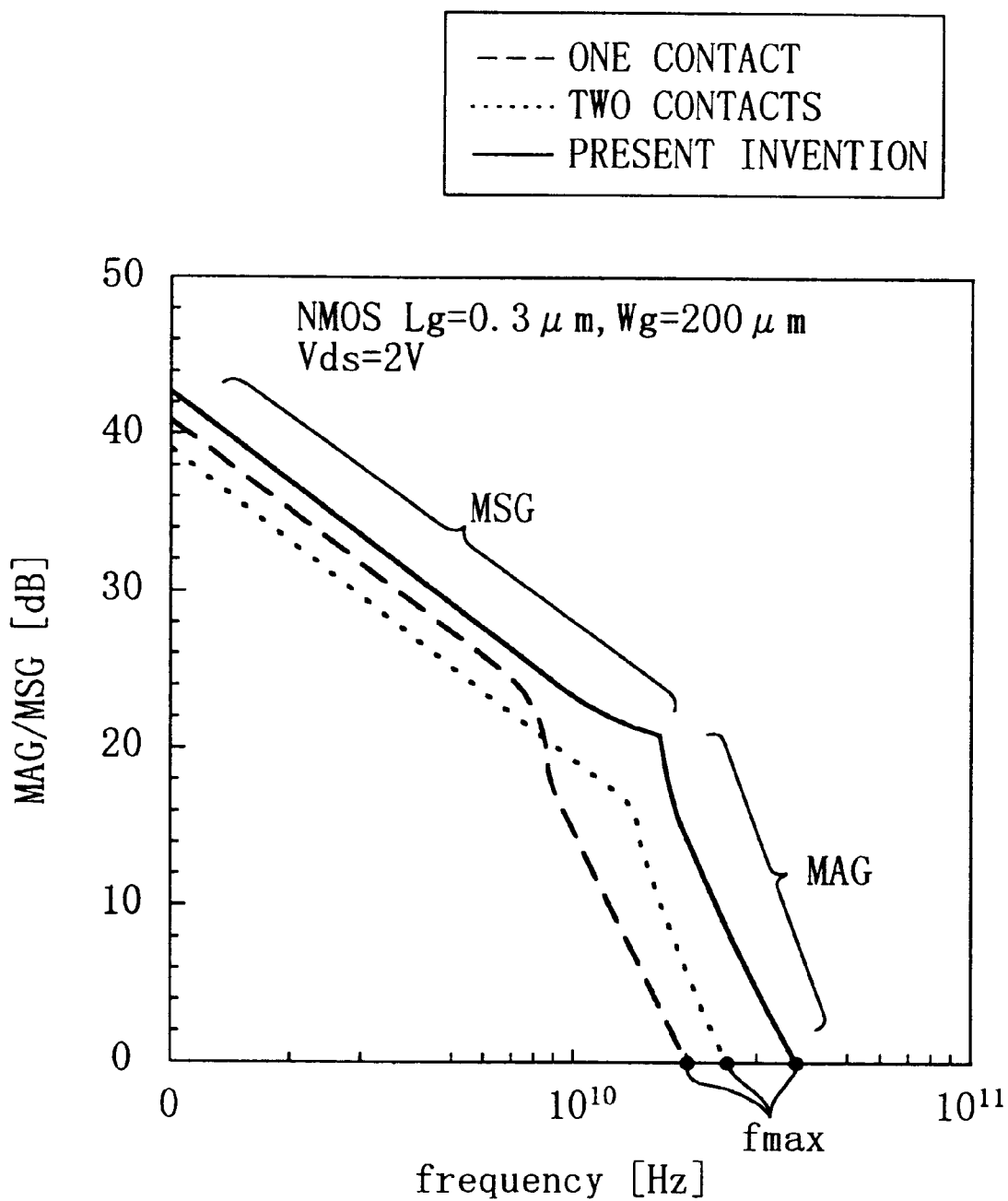
FIG. 13 is a diagram for showing data on dependency of a gain on a frequency in the MOSFET of this invention and conventional MOSFETs.

FIG. 13 is a diagram for showing comparison in an MSG (maximum stable gain) and an MAG (maximum available gain) between the conventional MOSFETs including the finger-shaped gate electrodes and the present MOSFET including the ring gate electrode. In FIG. 13, the abscissa indicates a frequency, and a crossing point between the line of the MAG and the abscissa corresponds to the maximum oscillation frequency fmax. The unit gate width Wu of one unit cell is 5 μm, whereas the unit gate width Wu corresponds to a length along the periphery of one ring gate electrode in the present MOSFET and corresponds to a finger length of one finger gate electrode in the conventional MOSFETs. With regard to the conventional MOSFETs, data on one provided with one contact at one end of the gate electrode (one-contact) and data on one provided with two contacts at both ends of the gate electrode (two-contacts) are shown. In any of the MOSFETs, the total gate width Wg is 200 μm, the gate length along the channel direction is 0.3 μm, and the drain voltage is 2 V. As is shown in FIG. 13, the maximum oscillation frequency fmax is largely improved in the present MOSFET.

Next, the relationship between the number of gate withdrawn wires and the minimum noise figure NFmin will be described. When the number of gate withdrawn wires is increased, the gate resistance Rg is decreased but the gate-source capacitance Cgs is increased. However, the gate resistance Rg and the gate-source capacitance Cgs are varied depending upon not only the number of gate withdrawn wires but also the shapes thereof.

Figure 14:
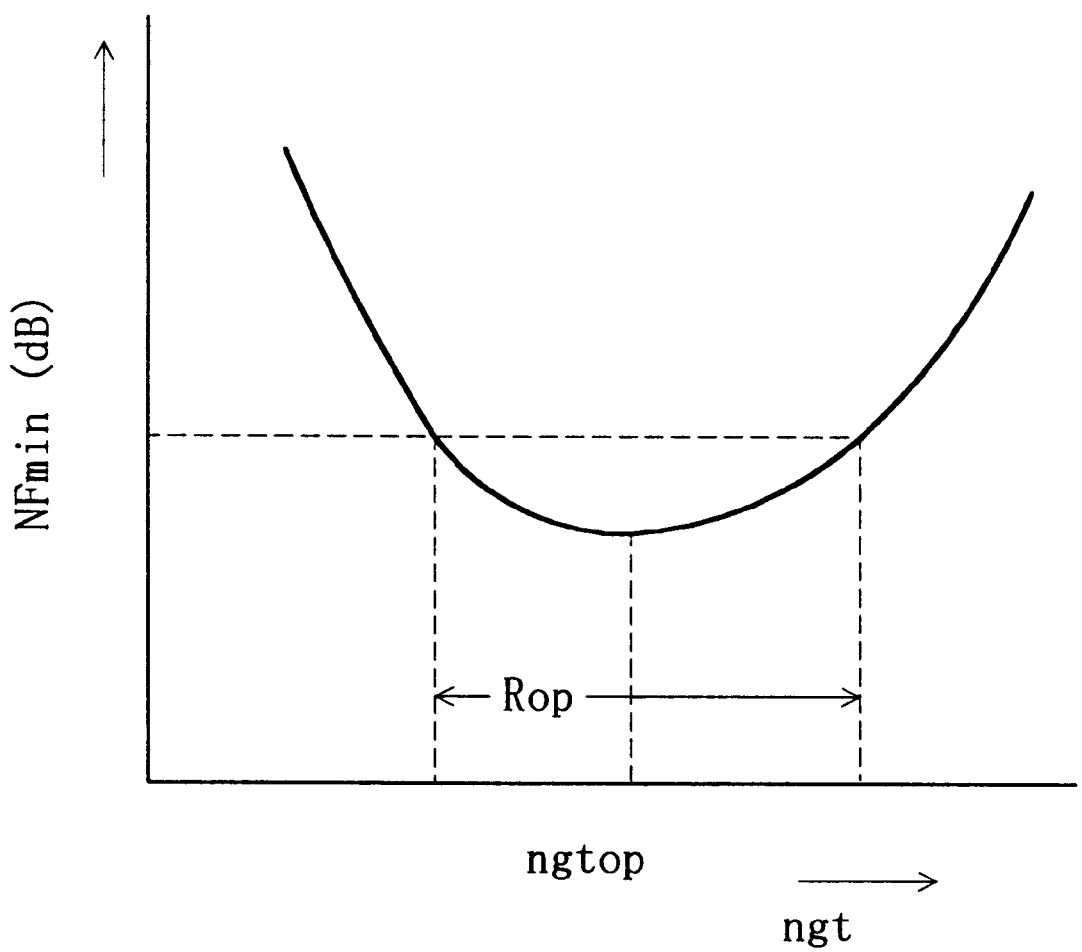
FIG. 14 is a characteristic diagram for showing a change of a minimum noise figure against the number of gate withdrawn wires in a MOSFET including a ring gate electrode.

FIG. 14 is a diagram for showing the relationship between the number ngt of gate withdrawn wires and the minimum noise figure NFmin obtained when the shape of the gate withdrawn wires is retained. As is obvious from FIG. 14, by previously determining the shape of the gate withdrawn wires, an optimal number ngtop of gate withdrawn wires for minimizing the minimum noise figure NFmin and a suitable range Rop for attaining the minimum noise figure NFmin smaller than a predetermined value can be determined. Furthermore, by adjusting the shape of the gate withdrawn wires so as to have a natural number as the optimal number ngtop of the gate withdrawn wires, the minimum noise figure NFmin can be further decreased.

In each of the aforementioned embodiments, a silicon substrate is used as the semiconductor substrate, which does not limit the invention. The silicon substrate can be replaced with, for example, an SOI substrate or a germanium substrate.

(Embodiment 9)

In a ninth embodiment, an example of application of the invention to an SOI device will be described.

Figure 15:
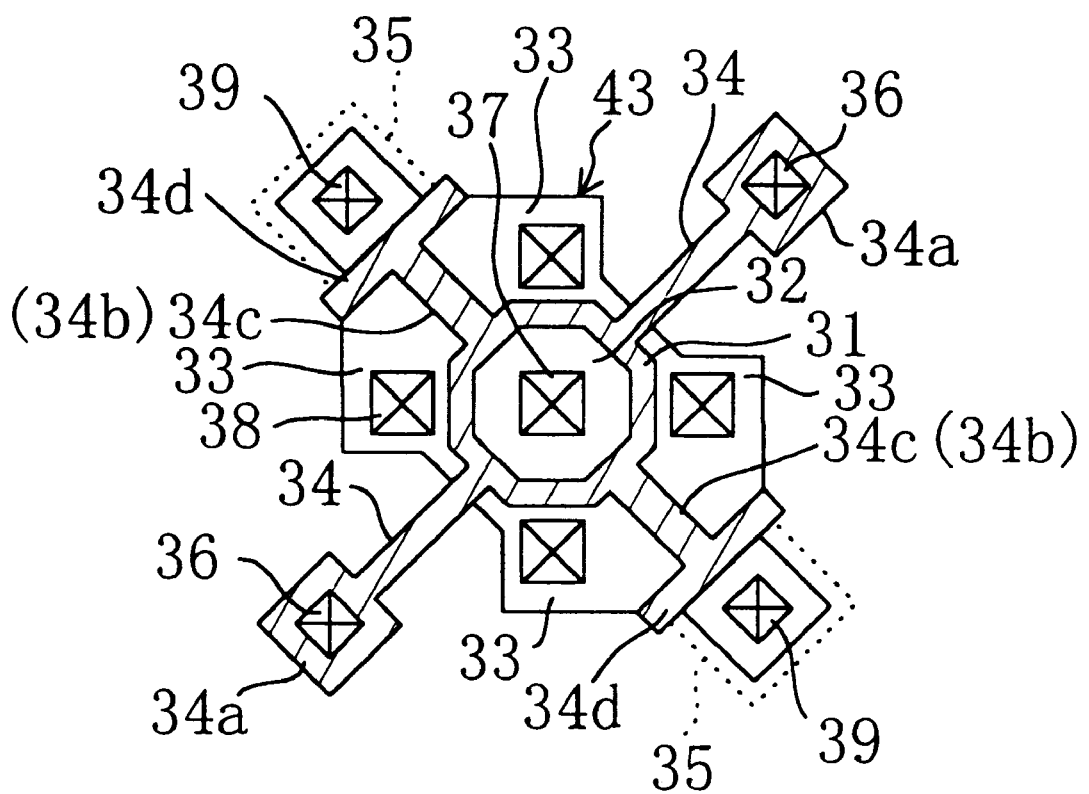
FIG. 15 is a schematic plan view for showing a layout of a unit cell of an SOI-MOSFET including a ring gate electrode in the shape of a regular octagon and a carrier introducing wire according to a ninth embodiment of the invention.
Figure 17:
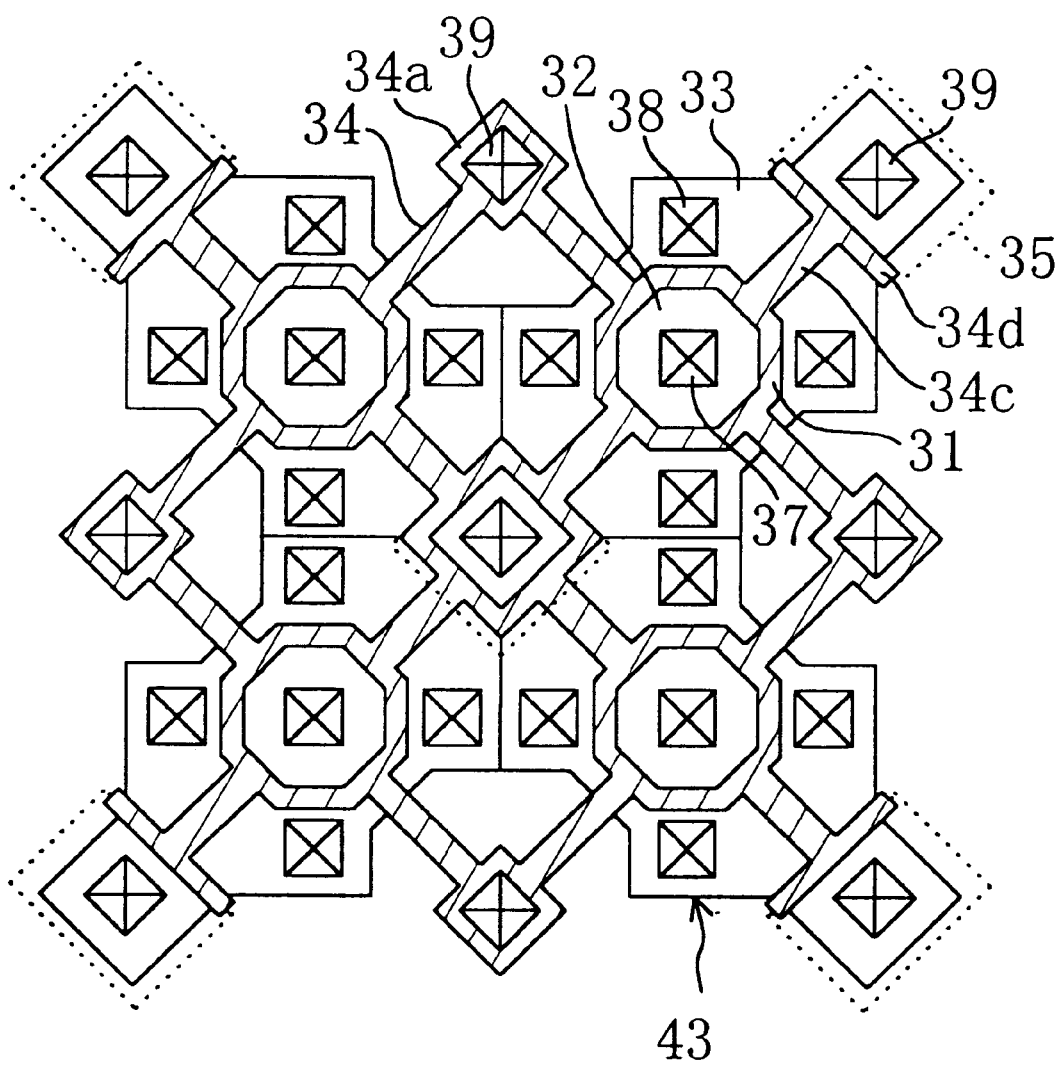
FIG. 17 is a schematic plan view for showing a layout of an exemplified MOSFET applicable to the ninth and tenth embodiments in which the unit cells of the ninth embodiment are disposed in a matrix.

FIG. 15 is a plan view for showing a layout of one unit cell of a MOSFET of this embodiment, and FIG. 17 is a plan view for showing an exemplified cell array structure of the MOSFET according to this embodiment or a tenth embodiment described below in which the unit cells of this embodiment are disposed in a matrix. As is shown in FIG. 17, an active area 43 is formed in an area surrounded with an isolation on a silicon substrate, and a large number of unit cells are disposed in the active area 43 (see FIG. 17). FIG. 15 shows one of these unit cells. In the active area 43 on the silicon substrate, a ring gate electrode 31 in the shape of a regular octagon is disposed with a gate oxide film (not shown) formed therebelow. In the active area 43, an area at the inside of the gate electrode 31 corresponds to a drain region 32 and an area at the outside of the gate electrode 31 corresponds to a source region 33 and source contact portions 35. The drain region 32 and the source region 33 are doped with an impurity of the same conductivity type at a high concentration. Furthermore, an area below the gate electrode 31 (namely, below the gate oxide film) corresponds to a channel region doped with an impurity of a different conductivity type from that included in the source region 33 and the drain region 32 at a concentration on a level for controlling the threshold value. The substrate contact portion 35 is doped with an impurity of the conductivity type same as that included in the channel region but different from that included in the source region 33 and the drain region 32 at a high concentration. Two gate withdrawn wires 34 are extended from opposing two sides among the eight sides of the octagonal gate electrode 31. Each of the gate withdrawn wires 34 extends over the source region 33 in the active area 43 to reach the isolation, and is provided, at its tip, with a contact portion 34a for signal connection with an upper wire. Although not shown in the drawings, the gate oxide film made from a silicon oxide film is also disposed between each gate withdrawn wire 34 and the silicon substrate. However, the gate insulating film can be made from a silicon nitride film or a nitrided silicon oxide film in stead of the silicon oxide film.

From upper wires, contacts for electrical connection with the respective portions of the MOSFET are formed. Specifically, each of the two contact portions 34a of the gate withdrawn wires 34 is provided with one gate contact 36, the drain region 32 is provided with one drain contact 37 at its center, the source region 33 is provided with four source contacts 38, and each of the two substrate contact portions 35 is provided with one substrate contact 39.

This embodiment is characterized by two carrier introducing wires 34c extending from the ring gate electrode 31 to the substrate contact portions 35 and tip portions 34d formed at the tips of the carrier introducing wires 34c. Each of the carrier introducing wires 34c extends in a direction perpendicular to the gate withdrawn wire 34. The source region 33 is divided by the two gate withdrawn wires 34 and the two carrier introducing wires 34c into four portions, each of which is provided with one source contact 38.

In this embodiment, in the active area 43, an area below each carrier introducing wire 34c, which extends from the ring gate electrode 31 disposed at the center, corresponds to a carrier introducing area 34b doped with an impurity of the same conductivity type at the same concentration as that included in the channel region, so that the carrier introducing area 34b can penetrate through the source region 33 and be communicated with the substrate contact portion 35, that is, a substrate potential fixing area. Accordingly, holes generated in a high electric field area in the vicinity of the drain region 32 in the channel region below the ring gate electrode 31 pass through the channel region and an area not working as the channel region (namely, an area below an intersection with the carrier withdrawn wire 34c) in an area below the ring gate electrode 31 doped with the impurity of the same conductivity type, also pass through the carrier introducing area 34b and the substrate contact portion 35, and are extracted to the substrate contact 39 of each unit cell.

In this manner, since the SOI-MOSFET of this embodiment includes the carrier introducing wires 34c branched from and extending from the ring gate electrode 31 to the substrate contact portions 35, the carrier introducing areas 34b communicated with the area below the ring gate electrode 31 and the substrate contact portions 35 (substrate potential fixing areas) are present per very short gate length of each unit cell. Therefore, excessive carriers stored below the gate electrode due to impact ionization and the like can be stably extracted regardless of the gate width, resulting in attaining stable fixation of a substrate potential independent of the gate width. As a result, a parasitic bipolar transistor can be prevented from being operated, and the source-drain breakdown voltage can be suppressed from decreasing.

Furthermore, since the ring gate electrode 31 is used, an edge transistor, which is generated in the vicinity of the boundary between a finger-shaped gate electrode and an isolation, can be avoided. Accordingly, the resultant SOI-MOSFET can attain a stable electric characteristic free from a parallel transistor phenomenon.

Moreover, since the area of the source region 33 is larger than that in a general MOSFET, the source resistance can be decreased more easily than in a conventional SOI-MOSFET even when the semiconductor area in an upper portion of the SOI substrate is thin.

(Embodiment 10)

Figure 16:
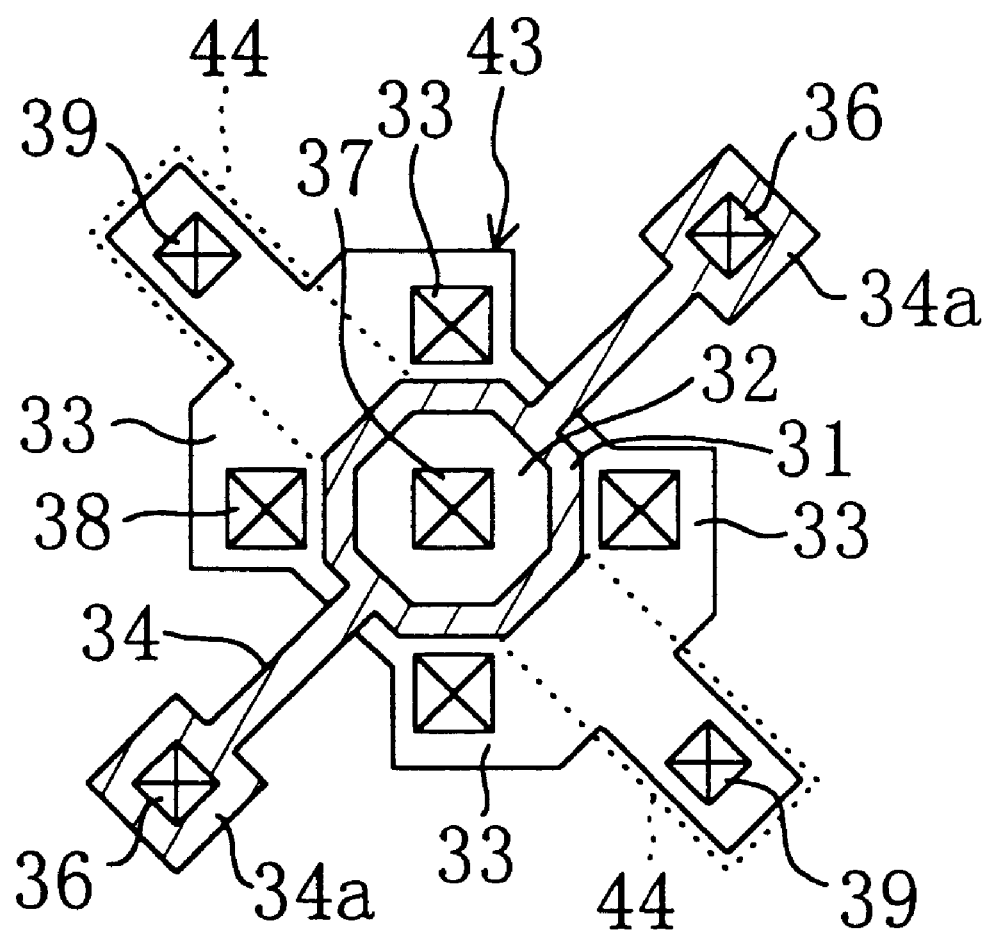
FIG. 16 is a schematic plan view for showing a layout of a unit cell of an SOI-MOSFET including a ring gate electrode in the shape of a regular octagon and a substrate potential fixing area directly connected with an area below the gate electrode according to a tenth embodiment of the invention.

FIG. 16 is a plan view for showing a layout of a unit cell of an SOI-MOSFET according to a tenth embodiment. The layout of this embodiment is basically the same as that of the ninth embodiment in a ring gate electrode 31, a drain region 32, a source region 33, gate withdrawn wires 34 and the like formed in an active area 43, and hence, like reference numeral are used to refer to like elements used in FIG. 15, and the description is omitted.

As a characteristic of this embodiment, in stead of providing the carrier introducing wire, a substrate contact portion 44 (substrate potential fixing area) extending from an edge of the ring gate electrode 31 to an area to be used as a substrate contact portion is doped with an impurity of the conductivity type same as that included in the channel region but different from that included in the source region 33 and the drain region 32 at a high concentration.

Accordingly, also in the SOI-MOSFET of this embodiment, the substrate contact portion 44 (substrate potential fixing area) penetrates through the source region 33 and is communicated with the area below the ring gate electrode 31 and an area for the substrate contact 39 including the impurity of the same conductivity type, and is larger than in other embodiments. As a result, holes generated in the high electric field area in the vicinity of the drain region 32 in the channel region below the ring gate electrode 31 pass through the channel region and an area not working as the channel region (namely, an area below an intersection with the substrate contact portion 44) in the area below the ring gate electrode including the impurity of the same conductivity type, also pass through the substrate contact portion 44 (substrate potential fixing area), and are extracted to the substrate contact 39 of each unit cell.

In this manner, since the SOI-MOSFET of this embodiment includes the wide substrate contact portions 44 communicated with the area below the ring gate electrode 31 and the area for the substrate contacts 39 per very short gate length of each unit cell. Therefore, the excessive carriers stored below the ring gate electrode 31 owing to the impact ionization and the like can be stably extracted regardless of the gate width, resulting in attaining a stable substrate potential fixation independent of the gate width. As a result, a parasitic bipolar transistor is prevented from being operated, and the source-drain breakdown voltage can be prevented from decreasing.

In particular, in the SOI-MOSFET of this embodiment, since the substrate contact portions 44 doped with the impurity at a high concentration are directly communicated with the area below the ring gate electrode 31, the holes can be advantageously rapidly extracted.

The entire layout of the SOI-MOSFET including a plurality of unit cells of this embodiment is herein neither shown nor described, but similarly to the SOI-MOSFET of the ninth embodiment shown in FIG. 17, the layout in which the unit cells are disposed in a matrix is adoptable. This is because, in any of the ninth and tenth embodiments, each unit cell has a structure of point symmetrical about the drain contact 37.

(Embodiment 11)

Figure 18:
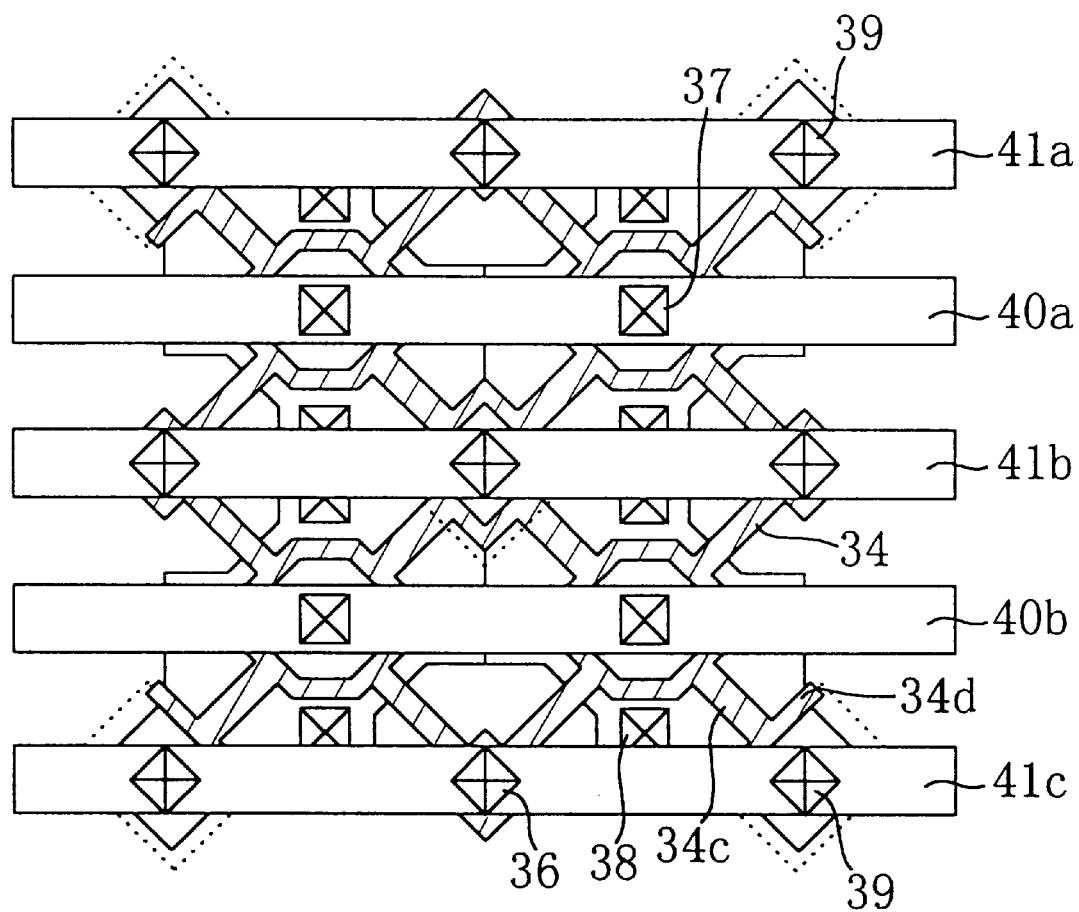
FIG. 18 is a schematic plan view for showing a layout of a MOSFET according to an eleventh embodiment in which the unit cells of the ninth embodiment are disposed in a matrix and provided with wires.

FIG. 18 is a schematic plan view for showing a wire layout of an SOI-MOSFET according to an eleventh embodiment, in which the SOI-MOSFET of FIG. 17 is provided with wires. However, in FIG. 18, a wire on a first layer is not shown for avoiding complication. The wire on the first layer is a source contact wire for connecting the source contacts 38 of the respective unit cells, and is formed substantially all over in a wide area excluding areas for the drain contacts 37, the gate contacts 36 and the substrate contacts 39. As wires on a second layer, drain contact wires 40a and 40b for connecting the drain contacts 37 of the respective unit cells and gate/substrate contact wires 41a through 41c for connecting the gate contacts 36 and the substrate contacts 39 are alternately formed in parallel. Between the surface of the substrate and the wire on the first layer and between the wire on the first layer and the wires on the second layer, first and second interlayer insulating films are respectively formed.

In the wire layout of the SOI-MOSFET of this embodiment, since the source contact wire is formed substantially all over in the wide area, the source inductance Ls can be decreased. In other words, the similar effect to that of the sixth through eighth embodiments on the bulk MOSFET can be attained in the SOI-MOSFET.

In particular, in this embodiment, in forming the layout of the unit cells into a cell array, the gate/substrate contact wires 41a through 41c working as gate contact wires as well as substrate contact wires are used, and hence, the gate potential is equalized to the substrate fixed potential. Accordingly, a so-called DT-MOSFET (dynamic threshold-voltage MOSFET) having high driving ability can be realized without using a dedicated wire and without increasing a circuit area.

(Embodiment 12)

In a twelfth embodiment, an LSI for a portable telephone including the MOSFET provided with the ring gate electrode of any of the aforementioned embodiments will be described.

Figure 19:
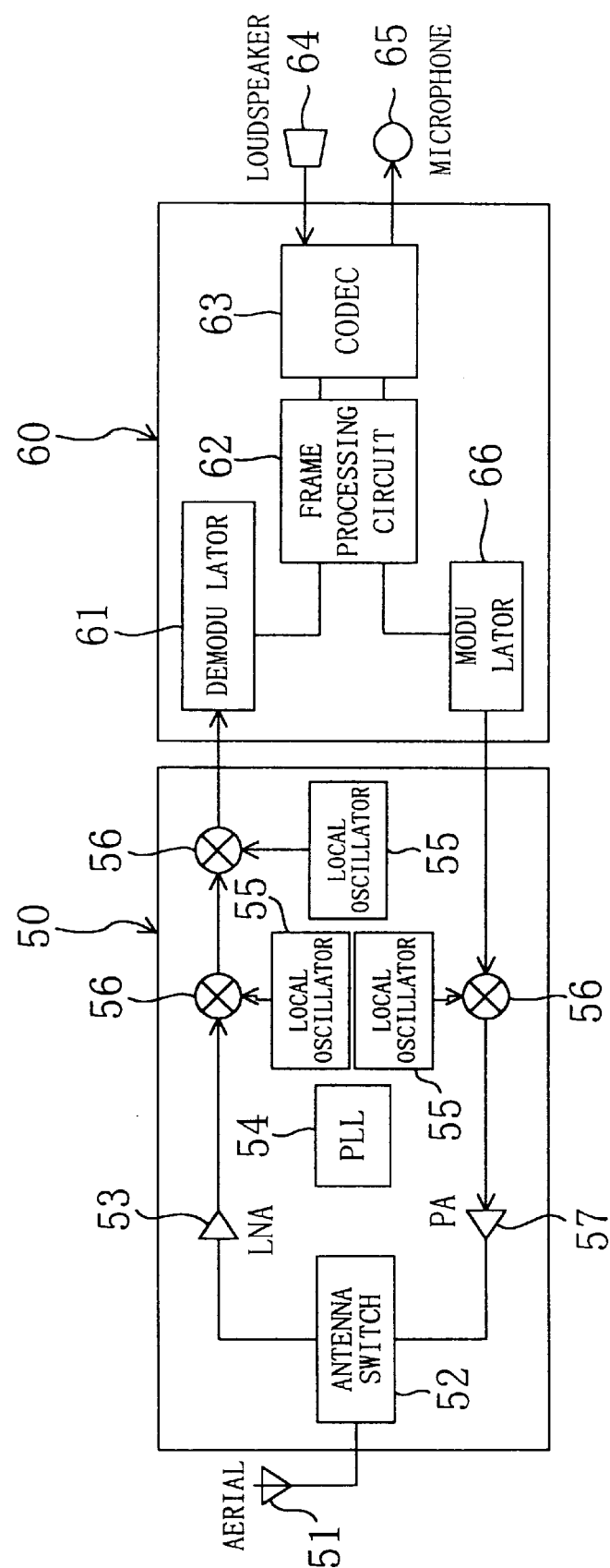
FIG. 19 is a schematic block circuit diagram for showing the configuration of a one-chip LSI for a portable telephone according to a twelfth embodiment of the invention.
Figure 20:
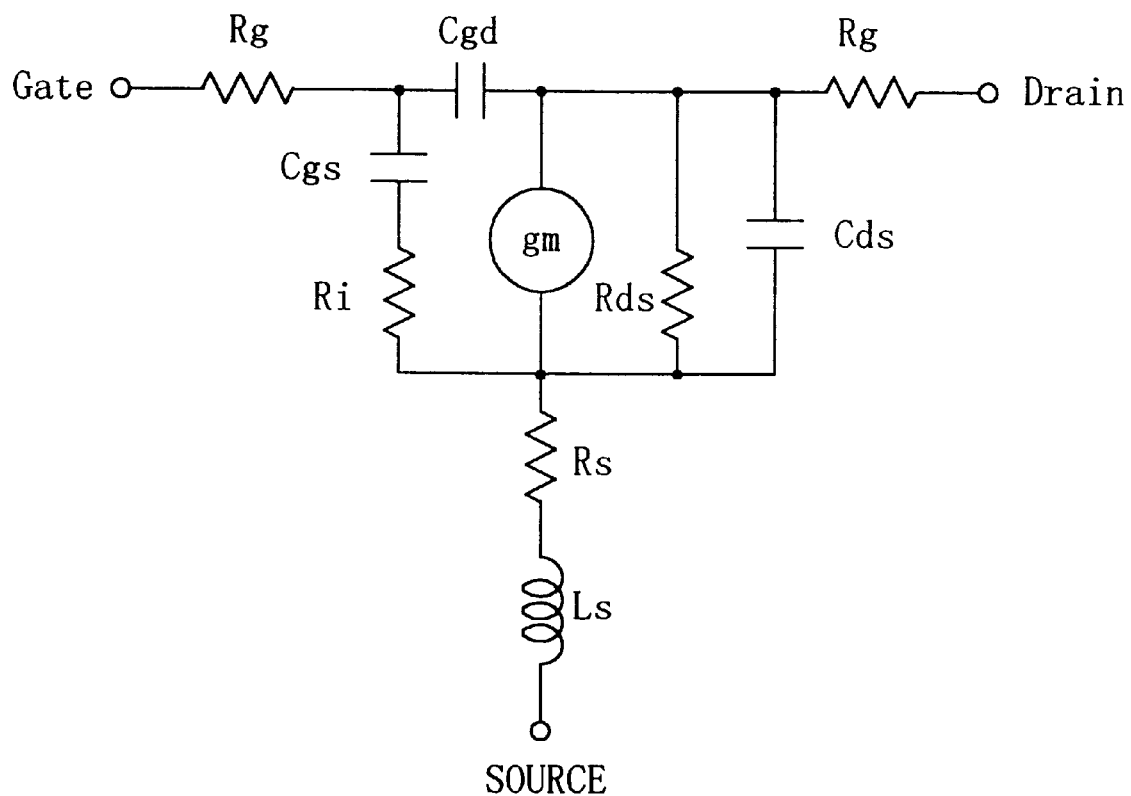
FIG. 20 is an equivalent circuit diagram of a general MOSFET.

FIG. 19 is a block circuit diagram of the LSI for a portable telephone of this embodiment, in which an RF/IF signal processing circuit 50 and a base band signal processing circuit 60 are disposed on a common semiconductor substrate. The RF/IF signal processing circuit 50 includes an antenna switch 52 for switching signal connection with an aerial 51 between a receiving mode and a transmitting mode, a low noise amplifier (LNA) 53 for amplifying a high frequency signal input through the antenna switch 52, a power amplifier 57 for supplying a high frequency transmitting signal to the antenna switch 52, a PLL circuit 54, a local oscillator 55, and a mixer 56. The base band signal processing circuit 60 includes a demodulator 61 for receiving a received signal from the low noise amplifier 53 through the mixer 56, a modulator 66 for supplying a transmitting signal to the power amplifier 57 through the mixer 56, a frame processing circuit 62 for receiving the output of the demodulator 61 and supplying the transmitting signal to the modulator 66, and a CODEC circuit 63 for converting a signal from the frame processing circuit 62 and supplying the converted signal to a loudspeaker 64 and for converting a signal from a microphone 65 and supplying the converted signal to the frame processing circuit 62.

In the aforementioned configuration, the performance of the low noise amplifier (LNA) 53 largely affects the entire circuit particularly when the other elements are disposed on the common semiconductor substrate, and hence, special attention should be paid -to the manufacture of the low noise amplifier 53. Therefore, it is conventionally particularly difficult to build a low noise amplifier (LNA) in a one-chip LSI such as the LSI for a portable telephone. However, according to this invention, as described in the aforementioned embodiments, when the MOSFET with the ring gate electrode having a good noise characteristic and a high gain is mounted on the common substrate together with other circuits, the LSI for a portable telephone and the like can be fabricated.

In other circuits apart from the low noise amplifier (LNA) 53, the ring gate electrode structure can be adopted. However, the MOSFET having the ring gate electrode structure has a slightly larger area than the conventional MOSFET having the finger-shaped gate structure. Therefore, it is preferred that the MOSFET having the ring gate electrode structure is used in a circuit particularly required of a low noise characteristic and that other types of MOSFETs are used in the other circuits.

In this embodiment, all the circuits shown in FIG. 19 are built in one chip on the common substrate, but it goes without saying that a part of these circuits can be formed on another semiconductor chip.

(Other embodiments)

In each of the aforementioned embodiments, the plan shape of the ring gate electrode is a square or an octagon, which does not limit the invention. The ring gate electrode can be in the shape of any polygon such as a hexagon and a triangle or a circle. However, the octagonal shape is advantageous because it can realize a highly symmetrical ring shape in a range where resolving power of a reticle is good and layout data are accurately retained.

In each of the aforementioned embodiments, the ring gate electrode is in the shape of a closed ring, but a part of the gate electrode can be opened. In such a case, an isolation is preferably formed below the open portion. This is because the source region and the drain region can be prevented from being communicated with each other through the open portion of the ring gate electrode even when impurity ions are implanted from above the gate electrode in forming the source region and the drain region.

What is claimed is:

1. A semiconductor device comprising plural unit cells formed on a semiconductor substrate and functioning as a high frequency signal amplifier FET,
    wherein said unit cells include:
        a ring gate electrode formed on said semiconductor substrate;
        a drain region formed in said semiconductor substrate at an inside of said gate electrode;
        a drain contact formed on said drain region;
        a source region formed in said semiconductor substrate at an outside of said gate electrode and larger than said drain region;
        a source contact formed on said source region;
        an insulating film for separation formed on a portion of said semiconductor substrate adjacent to said source region;
        a gate contact;
        a pad on which said gate contact is formed, said pad being formed on said insulating film; and
        a gate withdrawn wire connecting said gate electrode and said pad,
    wherein said source region is provided with a pattern of regular polygon which has a cut-off portion in a plan view; said insulating film extends to said cut-off portion; and said pad extends so as to cover said insulating film.

2. A semiconductor device comprising plural unit cells formed on a semiconductor substrate,
    wherein each of said unit cells comprises:
        a ring gate electrode formed on said semiconductor substrate;

a drain region formed in said semiconductor substrate at an inside of said gate electrode;

a drain contact formed on said drain region;

a source region formed in said semiconductor substrate at an outside of said gate electrode;

a source contact formed on said source region;

a gate contact;

pads on which each of said gate contacts is formed respectively, said pads being formed on two portions of said semiconductor substrate with said source region interposed therebetween and formed opposite to each other; and two gate withdrawn wires connecting said gate electrode and said pads, and respective plane patterns of each of said unit cells have symmetrical shapes for allowing said plural unit cells to be regularly disposed on said semiconductor substrate, said semiconductor device further comprising:

a substrate contact portion formed in a part of said semiconductor substrate;

a substrate contact formed on said substrate contact portion; and source/substrate contact wires for connecting tips of said source contacts and said substrate contacts of said plural unit cells.

3. A semiconductor device comprising plural unit cells formed on a semiconductor substrate, wherein each of said unit cells comprises:

a ring gate electrode formed on said semiconductor substrate;

a drain region formed in said semiconductor substrate at an inside of said gate electrode;

a drain contact formed on said drain region;

a source region formed in said semiconductor substrate at an outside of said gate electrode;

a source contact formed an said source region;

a gate contact;

pads on which each of said sate contacts is formed respectively, said pads being formed on two portions of said semiconductor substrate with said source region interposed therebetween and formed opposite to each other; and two gate withdrawn wires connecting said gate electrode and said pads, and respective plane patterns of each of said unit cells have symmetrical shapes for allowing said plural unit cells to be regularly disposed on said semiconductor substrate, said semiconductor device further comprising:

a semiconductor region for a substrate contact provided to merely unit cells disposed at a periphery among said plural unit cells in said semiconductor substrate, said semiconductor region having a conductivity opposite to each of said source/drain regions;

substrate contacts formed on said semiconductor region for said substrate contact; and substrate contact wires for connecting tips of said substrate contacts.

4. A semiconductor device comprising plural unit cells formed on a semiconductor substrate and functioning as a high frequency signal amplifier FET, wherein said unit cells include:

a ring gate electrode formed on said semiconductor substrate;

a drain region formed in said semiconductor substrate at an inside of said gate electrode;

a drain contact formed on said drain region;

a source region formed in said semiconductor substrate at an outside of said gate electrode and larger than said drain region;

a source contact formed on said source region;

an insulating film for separation formed on a portion of said semiconductor substrate adjacent to said source region;

a gate contact;

a pad on which said gate contact is formed, said pad being formed on said insulating film; and a gate withdrawn wire connecting said sate electrode and said pad, wherein said unit cells further include:

a substrate contact; and a semiconductor region on which said substrate contact is formed, said semiconductor region having a conductivity opposite to each of said source/drain regions.

5. A semiconductor device comprising plural unit cells formed on a semiconductor substrate and functioning as a high frequency signal amplifier FET, wherein said unit cells include:

a ring gate electrode formed on said semiconductor substrate;

a drain region formed in said semiconductor substrate at an inside of said gate electrode;

a drain contact formed on said drain region;

a source region formed in said semiconductor substrate at an outside of said gate electrode and larger than said drain region;

a source contact formed on said source region an insulating film for separation formed on a portion of said semiconductor substrate adjacent to said source region;

a gate contact;

a pad on which said gate contact: is formed said pad being formed on said insulating film; and a gate withdrawn wire connecting said -gate electrode and said pad, wherein said source region is provided with a pattern of regular polygon which has a cut-off portion in a plan view; said insulating film extends to said cut-off portion; and said gate withdrawn wire passes over said cut-off portion and is connected with said pad.

6. A semiconductor device comprising plural unit cells formed on a semiconductor substrate, wherein each of said unit cells comprises:

a ring gate electrode formed on said semiconductor substrate;

a drain region formed in said semiconductor substrate at an inside of said gate electrode;

a drain contact formed an said drain region;

a source region formed in said semiconductor substrate at an outside of said gate electrode;

a source contact formed on solid source region;

a gate contact;

pads on which each of said gate contacts is formed-respectively, said pads being formed on two portions of said semiconductor substrate with said source region interposed therebetween and formed opposite to each other; and two gate withdrawn wires connecting said pate electrode and said pads, and respective plane patterns of each of said unit cells have symmetrical shapes for allowing said plural unit cells to be regularly disposed on said semiconductor substrate, said semiconductor device further comprising:

a substrate contact; and a semiconductor region on which said substrate contact is respectively formed, said semiconductor region being formed on two portions of said semiconductor substrate with said source region interposed therebetween, being formed opposite to each other, and having a conductivity opposite to each of source/drain regions.

* * * * *